(12) United States Patent
Sugimoto

(10) Patent No.: US 7,904,275 B2
(45) Date of Patent: Mar. 8, 2011

(54) DATA PROCESSING AND MANAGEMENT EQUIPMENT AND METHOD FOR DATA ANALYSIS OF PARTICLES IN SURFACE STRUCTURING DEVICE OR FILM FORMING DEVICE

(75) Inventor: Masaaki Sugimoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 484 days.

(21) Appl. No.: 12/112,492

(22) Filed: Apr. 30, 2008

(65) Prior Publication Data

US 2009/0112515 A1     Apr. 30, 2009

(30) Foreign Application Priority Data

Oct. 30, 2007   (JP) .................................. 2007-282014

(51) Int. Cl.
G06F 19/00      (2006.01)
(52) U.S. Cl. .......................................... 702/179; 438/14
(58) Field of Classification Search .................. 702/179, 702/182–185; 438/5, 14, 17
See application file for complete search history.

(56) References Cited

U.S. PATENT DOCUMENTS 7,125,383 B2 * 10/2006 Hoctor et al. ................. 600/438

FOREIGN PATENT DOCUMENTS

| JP | 6-188223 | 7/1994 |
| JP | 11-176714 | 7/1999 |
| JP | 2005-535130 | 11/2005 |
| WO | WO 99/24640 | 5/1999 |

OTHER PUBLICATIONS

T. Moriya, M. Shimada and K. Okuyama; "Reduction of particles in plasma etching device—Monitoring of particles and inhibition of production of particles in etching device",, Clean Technology (Feb. 2006).
N. Ito, et al., "Reduction of particles-contamination in plasma etching equipment by dehydration of chamber wall", Proceedings of Related Applied Physics Associated Meeting, 26a-D2 (Sep. 2002).
S. Sato, A. Tsukune, T. Goto; Visualization of backflow particles from turbo molecular pump—Are particles in lower chamber really recoiled?, Clean Technology (Jun. 2003).

* cited by examiner

Primary Examiner — Edward Raymond
(74) Attorney, Agent, or Firm — Young & Thompson

(57) ABSTRACT

Management of countermeasure of pollution particles deposited on an object to be processed is optimized based on a cause of the pollution. Data processing and management equipment 1 comprises a functional approximation part 2 to make a mathematical model of a relation between measured numbers of particles deposited on a substrate during processing in a surface structuring device or a film forming device and accumulated amount processed after cleaning up of the device by a functional equation based on a cause of the deposit of the particles. A judging part 3 specifies the cause of the deposit of particles by comparing the functional equation with the measured numbers of particles.

22 Claims, 18 Drawing Sheets

NUMBER OF FOREIGN PARTICLES ON SURFACE OF OBJECT (SUBSTRATE) TO BE VACUUM PROCESSED

CENTER OF STANDARD : $Y = Y_o \times EXP[K \times T]$

UPPER LIMIT OF STANDARD : $Y_{max} = (Y_o + \alpha_{upper}) \times EXP[(K + \beta_{upper}) \times T]$ LOWER LIMIT OF STANDARD : $Y_{min} = (Y_o - \alpha_{lower}) \times EXP[(K - \beta_{lower}) \times T]$

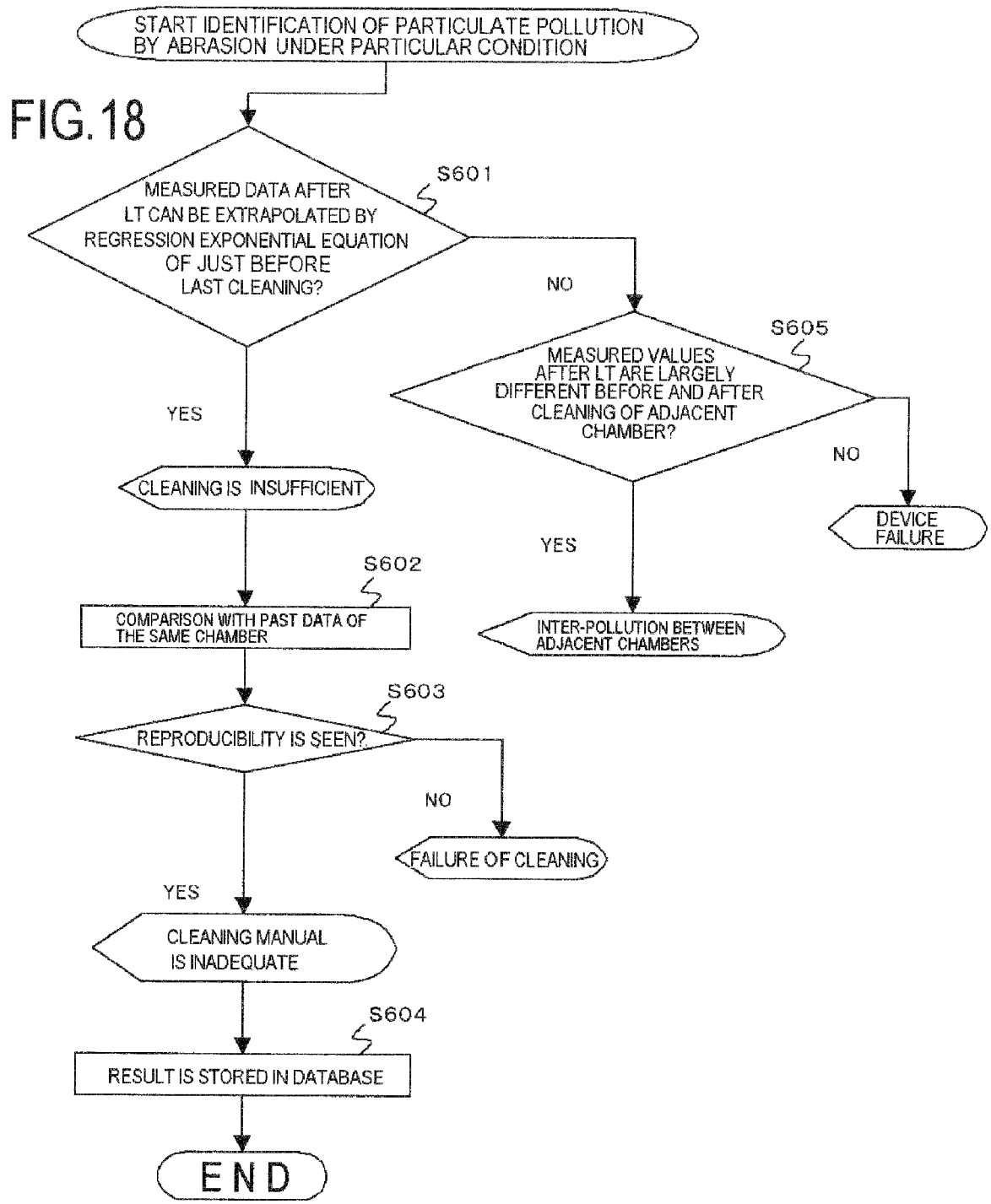

DATA PROCESSING AND MANAGEMENT EQUIPMENT AND METHOD FOR DATA ANALYSIS OF PARTICLES IN SURFACE STRUCTURING DEVICE OR FILM FORMING DEVICE

REFERENCE TO RELATED APPLICATION

This application is based upon and claims the benefit of the priority of Japanese patent application No. 2007-282014, filed on Oct. 30, 2007, the disclosure of which is incorporated herein in its entirety by reference thereto.

FIELD OF THE INVENTION

This invention relates to a data processing and management equipment and method for data analysis of foreign particles in surface structuring device or film forming device.

BACKGROUND OF THE INVENTION

Foreign particles occurring during fabrication process of LSIs, flat panel displays or solar panels often cause a reduction of yield and/or availability of the fabrication device. A high cleanness is requested in the fabrication device of LSIs, flat panel displays or solar panels because the foreign particles often deposit on substrates of wafers or glasses, and so on.

Practically, major foreign particles occur in a surface structuring device such as a plasma-etching device or a film forming device such as a sputtering device or a CVD device. The foreign particles are considered to be a main cause to reduce the yield and/or availability of the fabrication devices by depositing on the substrates (Non-patent Documents 1, 3). In addition the foreign particles sometimes play a role of mask during exposure, surface structuring or film forming processes. As a result, the foreign particles may cause circuit pattern defects even after removal of the foreign particles by cleaning of the substrates and reduce the yields or quality of the products.

The numbers of foreign particles are observed using a monitoring substrate in a mass production lines, and when the number exceeds a predetermined value, insides of the manufacturing devices are cleaned. However, it is difficult to clean the devices frequently because it takes much time and costs and therefore it reduces the availability of the devices.

A dry etching apparatus to process a surface of a substrate is a processing device that generates deposition of foreign particles during a surface structuring. Semiconductor wafers to be processed are introduced in an evacuated chamber by a transporting device. A securing device using electrostatic force, for example is provided in the evacuated chamber. An evacuation device is connected with the evacuated chamber and the chamber is maintained in negative (vacuum) pressure. A process gas is introduced in the chamber by a gas introducing device and an etching energy is supplied by a reaction energy supplying device and then the chamber is served as a dry-etching device to process the surface of the substrates.

A part of reaction products produced during the surface structuring of the wafers is discharged by the evacuation device or taken out with the substrates; however, the remainder is accumulated in the chamber. Generally, the inside of the chamber becomes dirty, that is, the amount of deposits is increased depending on the quantity of the substrates processed in the chamber. Therefore, the accumulated foreign particles inside the chamber should be removed (cleaned) and then a new process cycle (period) is started.

A method to judge and treat an error data by feedback control system is disclosed in Patent Document 1

In Patent Document 2, it is described that there is no proportional relation between the amount of deposits and foreign particles deposited on the substrates and the foreign particles has a tendency to increase when the amount of deposit exceeds some threshold value.

It is pointed out in Patent Document 3 there is a tendency that the foreign particles are produced at the area where an etching process is not performed after dry cleaning and the foreign particles deposited increase exponentially as an accumulated thickness of formed film becomes large.

It is described that a cleaning time can be estimated by measuring a change of a thickness of impurities deposited on a plate in a process chamber in Patent Document 4.

[Patent Document 1]
  JP Patent Kokai Publication No. JP-P2005-535130A
[Patent Document 2]
  International Laid-Open No. WO99/24640
[Patent Document 3]
  JP Patent Kokai Publication No. JP-H06-188223A
[Patent Document 4]
  JP Patent Kokai Publication No. JP-H11-176714A
[Non-Patent Document 1]
  T. Moriya, M. Shimada and K. Okuyama; "Reduction of particles in plasma etching device—Monitoring of particles and inhibition of production of particles in etching device", Clean Technology (February, 2006).
[Non-Patent Document 2]
  N. Ito, et. al.; "Reduction of particles-contamination in plasma etching equipment by dehydration of chamber wall", Proceedings of Related Applied Physics Associated Meeting, 26a-D-2 (September, 2002).
[Non-Patent Document 3]
  S. Sato, A. Tsukune, T. Goto; "Visualization of backflow particles from turbo molecular pump—Are particles in lower chamber really recoiled?", Clean Technology (June, 2003).

SUMMARY

The present inventor has recognized as follows. The entire disclosures of the above Patent Documents and Non-Patent Document are incorporated herein by reference thereto. The method disclosed in Patent Document 1 simply estimates validity of measured values although it uses statistical data.

It is described that the foreign particles tend to increase when the amount of deposit exceeds some threshold value in Patent Document 2. However, the inventor has found another relation. It is described that the foreign particles deposited increase exponentially as an accumulated thickness of formed film becomes large; however, the reasons are not clear.

The method disclosed in Patent Document 4 suggested that the cleaning time is determined by measuring the thickness of impurities deposited on a plate placed in a process chamber continuously and when the thickness exceeds a predetermined value, it is decided that it is the time for cleaning. However, the method to predict the anticipated time to exceed the value is simply by comparing the measured value with a threshold value.

One of the problems not solved by the methods described in these Documents is that it is difficult to predict the number of foreign particles deposited on surfaces of substrates or products, which cause degradation of quality or poor yields of the substrates or products, in a surface structuring device such as an etching device or a film forming device such as a CVD in which the substrates and gas components are reacted under negative pressure.

Component devices such as a vacuum chamber, an evacuation device, a gas components introducing device, a power supply for reaction and a transportation device of the surface structuring device such as a dry etching device or the film forming device such as a CVD should be cleaned periodically to prevent degradation of quality or decreasing of the yields of the substrates or products to be processed. Another problem is that it is difficult to optimize the cleaning time of the vacuum processing component devices explained above.

In conclusion, there is a problem that it is difficult to estimate the causes of the deposit of foreign particles and optimize countermeasures of the causes.

In a first aspect of the present invention, a data processing and management equipment comprises a functional approximation part to approximate a relation between a measured number of foreign particles deposited on a substrate during processing in a surface structuring device or a film forming device and an accumulated amount processed after clean up of the device by a functional equation based on a (each) cause of the deposit of the foreign particles. A judging part specifies the cause of the deposit of foreign particles by comparing the functional equation with the measured number of foreign particles. The data processing and management equipment may be a part (unit) of another device.

The present equipment can estimate (focus or target) one by one (or sequentially) cause of the deposit of foreign particles on the substrates among some possibilities by inputting measured numbers of foreign particles deposited on the substrates into the present equipment.

In a second aspect of the present invention, a data processing and management method comprises the following steps a) and b): a) approximating a relation between a measured number of foreign particles deposited on a substrate during processing by a surface structuring device or a film forming device and accumulated amount processed after clean up of the device by a functional equation based on a cause of the deposit of the foreign particles; and b) specifying cause of the deposit of foreign particles by comparing the functional equation with the measured number of foreign particles.

The method can one by one estimate cause of the deposit of foreign particles on the substrates among some possibilities.

The meritorious effects of the present invention are summarized as follows. The present equipment or method can estimate one by one (i.e., sequentially) a cause of the deposit of foreign particles on the substrates among some possibilities. Therefore, the present equipment or method can improve quality and yields of the substrates to be processed.

BRIEF DESCRIPTION OF THE DRAWINGS

In the accompanying drawings:

FIG. 18 is a flowchart for identification of wafer pollution when pollution by an abrasion of a deposition under a particular condition is predicted by the steps shown in FIG. 13.

PREFERRED MODES OF THE INVENTION

Figure 1:
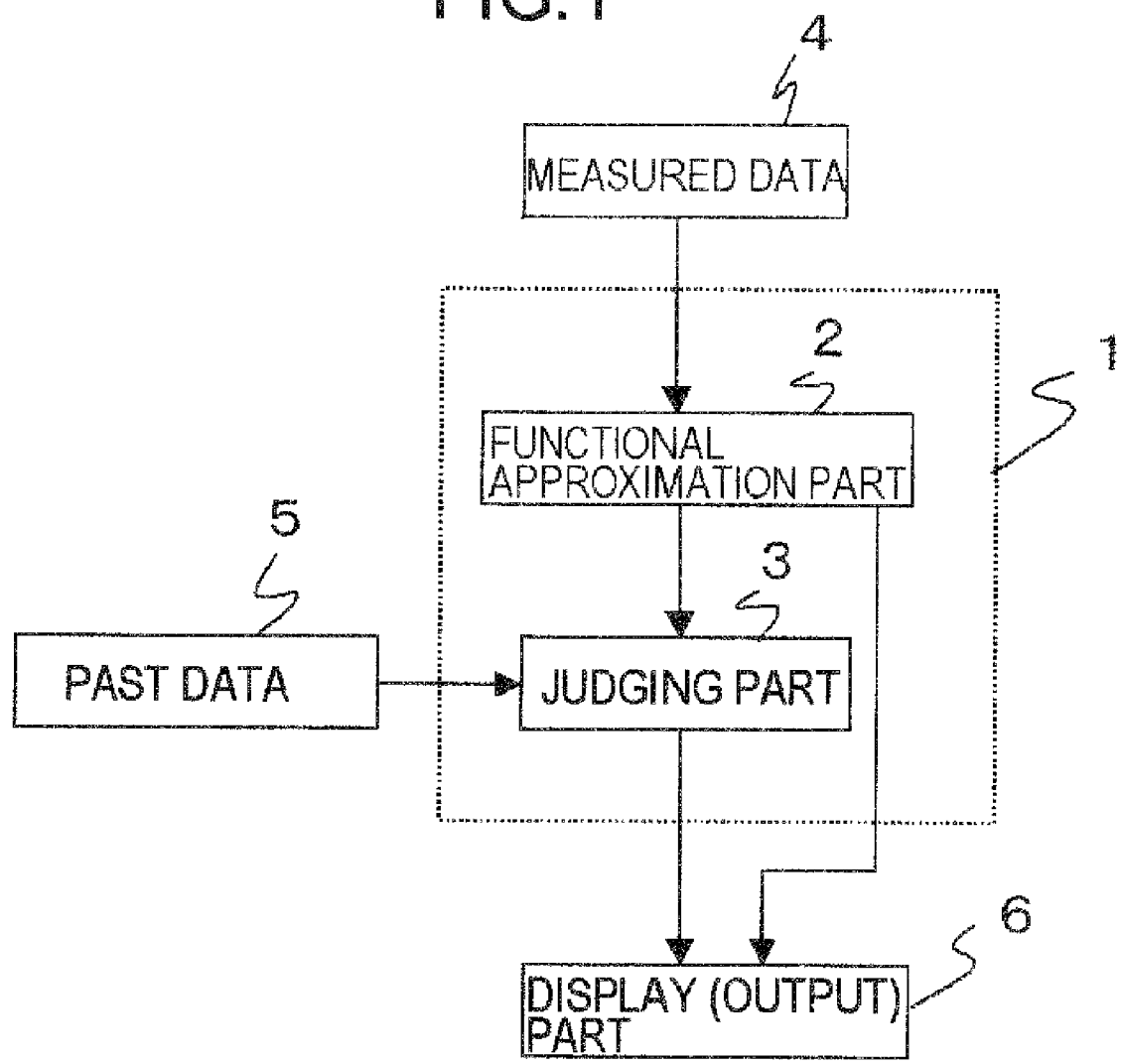
FIG. 1 is a block diagram of an exemplary embodiment of data processing and management equipment of the present invention.

The following preferred modes may be implemented.

The functional equation may be an exponential equation, and the judging part may specify the cause of the deposit of particles by comparing an initial value, an inclination of a regression exponential equation obtained by regression analysis of the measured numbers of particles and coefficient (s) of determination of the exponential equation with experienced values.

The judging part may estimate existence of disorder or cleaning time of the surface structuring device or the film forming device by comparing an initial value, an inclination and coefficient(s) of determination of a regressive exponential equation of every process cycle after cleaning with each other, wherein the regressive exponential equation is obtained by a regression analysis on an amount of particles increased per unit area to an accumulated depth of the structured surface or an accumulated height of the formed film per unit area after cleaning up of the surface structuring device or the film forming device.

The judging part may estimate existence of an influence of an adjacent device upon the number of particles by comparing the number of particles per unit area against an accumulated depth of the structured surface or an accumulated height of the formed film per unit area after cleaning up of the surface structuring device or the film forming device with an operation time, date and contents of the operation of the adjacent device.

The judging part may specify the cause of the deposit of particles by a result of analysis of shape and composition of the particles.

A display part may display on a screen of the equipment and/or output data of the measured particles and the functional approximation line in a graph of semi-logarithmic coordinate system.

The display part may also graphically display the functional regression equation of the functional regression line and a coefficient(s) of determination representing accuracy of the functional regression equation.

The display part may also describe operation time and date, and contents of the operation of an adjacent device.

The display part may also display and/or output a result of judgment of the judging part.

The judging part may determine at least two kinds of tolerances of level of an initial value and gradient of the functional approximation equation as a center line of a standard.

The judging part may determine at least four kinds of tolerances of two kinds of levels of the initial values and two kinds of gradients of both a decreasing-type equation and an increasing-type equation when the functional approximation equation as a center line of a standard is a composite function of the decreasing-type equation and the increasing-type equation.

The functional equation may be an exponential equation, and the specifying step b) may specify the cause of the deposit of particles by comparing an initial value, a gradient of the regression exponential equation obtained by regression analysis of the measured numbers and coefficient(s) of determination of the exponential equation with experienced values.

The specifying step b) may estimate existence of disorder or cleaning time of the surface structuring device or the film forming device by comparing an initial value, a gradient and coefficient(s) of determination of a regressive exponential equation of every process cycle after cleaning with each other, wherein the regressive exponential equation is obtained by a regression analysis of an amount of particles increased per unit area to an accumulated depth of the structured surface or an accumulated height of the formed film per unit area after cleaning up of the surface structuring device or the film forming device.

The specifying step b) may estimate existence of an influence of an adjacent device upon the numbers of particles by comparing the numbers of particles per unit area against an accumulated depth of the structured surface or an accumulated height of the formed film per unit area after cleaning up of the surface structuring device or the film forming device with operation time and date, and contents of the operation of the adjacent device.

The specifying step of b) may specify the cause of the deposit of particles by a result of analysis on shape and a composition of the particles.

The data processing and management method may further comprise a step c):

c) displaying on a screen of an equipment and/or outputting data of the measured particles and the functional approximation line of a graph of semi-logarithmic coordinate system.

The step c) may also describe the functional regression equation of the functional regression line and coefficient(s) of determination representing accuracy of the functional regression equation in the graph.

FIG. 1 shows one exemplary embodiment of a data processing and management equipment 1 of the present invention. The data processing and management equipment 1 comprises a functional approximation part 2 to make a regression equation, as an approximation equation, using measured data 4 and a judging part 3 to review a validity of the mathematical model (equation) with past data 5 and to specify a cause of deposit of foreign particles by referring, if necessary, to other analytical results. The data processing and management equipment 1 also displays and/or outputs the equation and judgment results through a display (output) part 6.

Figure 2:
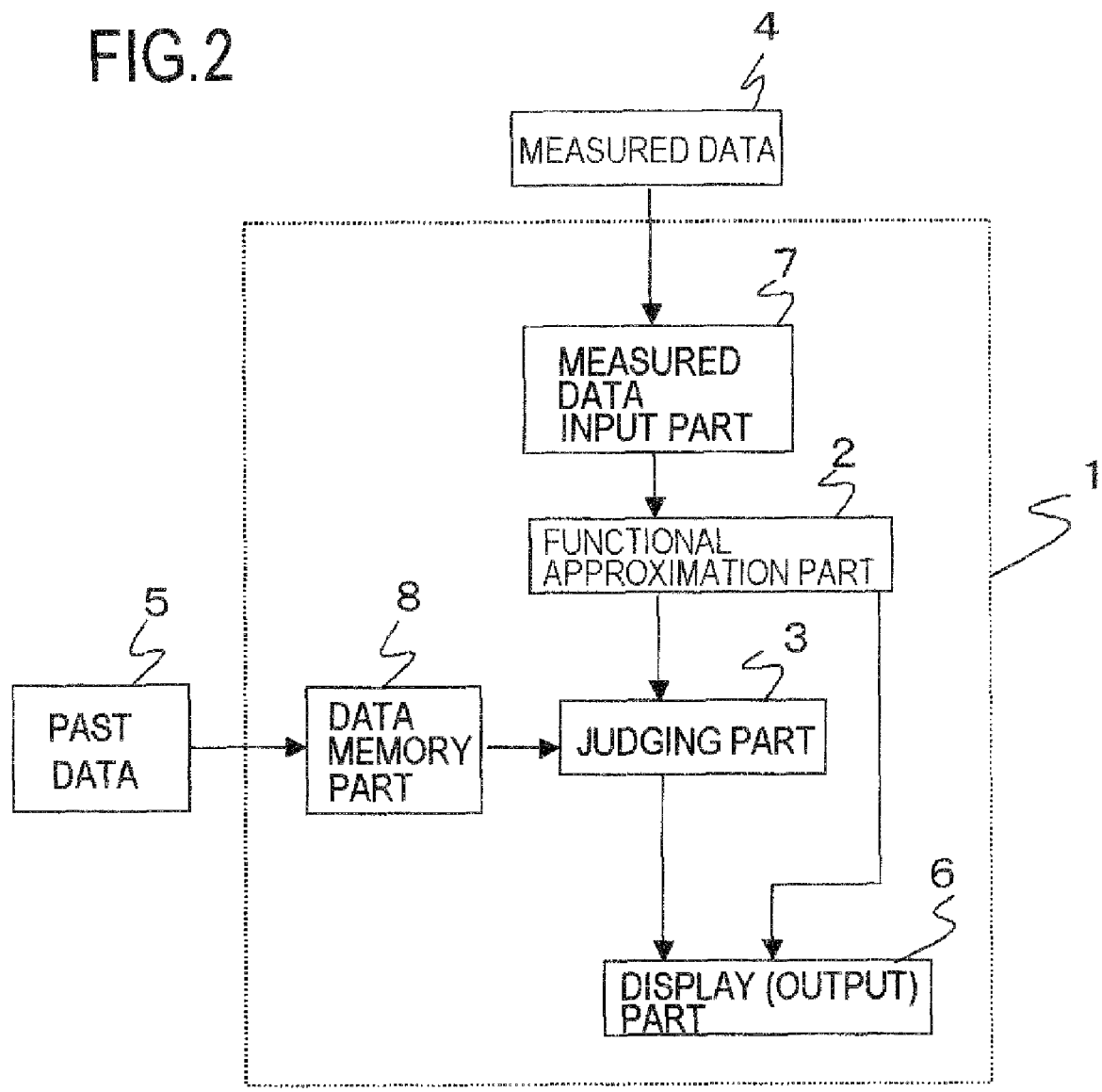
FIG. 2 is a block diagram of another exemplary embodiment of data processing and management equipment of the present invention.

As shown in FIG. 2, the data processing and management equipment 1 may comprise the functional approximation part 2, the judging (/comparing) part 3, the display (output) part 6 to display and/or output the equation and judgment results, measured data input part 7 to input measured data 4 and a data memory part 8 to store the past data for comparison.

Figure 3:
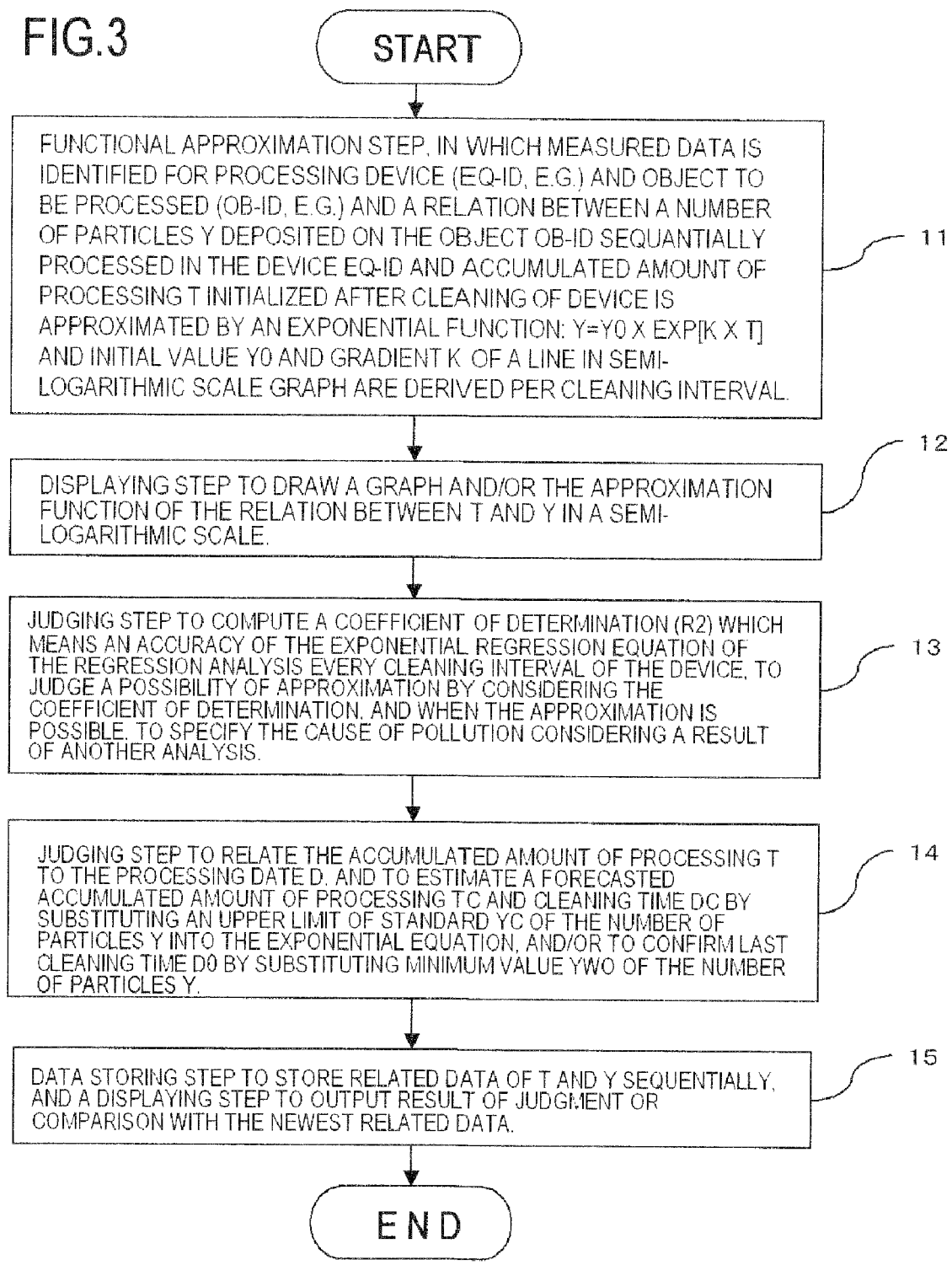
FIG. 3 shows detailed steps of an example of data processing and management method of the present invention.

FIG. 3 shows detailed steps which are executed by the data processing and management equipment 1 shown in FIG. 1 or 2.

Step 11 in FIG. 3 is one example of a step executed by the functional approximation part shown in FIG. 1 or 2. Pollution phenomena, that is, deposition of abrasion (detached or freed) particles on a substrate, after deposition of the foreign particles in accordance with an accumulated amount of etching in a processing device which produces foreign particles, can be approximated by a mathematical function. Specifically, the approximation is explained using a surface structuring device called dry etcher. When the foreign particles deposited on the substrates called wafers during dry etching process of the substrates is designated as Y and an accumulated amount of etching, which is initialized after every cleaning, is designated as T, the relation can be approximated by next equation:

$$Y = Y_0 \times \text{EXP}[K \times T]$$

where $Y_0$ is an initial value when T=0, and therefore a positive constant, EXP[ ] is the power of base e of natural logarithm and K is a gradient (inclination) of the exponential function drawn on a semi-logarithmic scale graph of T to Y and denoted as a positive constant.

Step 12 in FIG. 3 is one example of a step executed by the display (output) part shown in FIG. 1 or 2. The relation between the measured data T and Y is approximated by an exponential function and an approximated line by the functional equation on the semi logarithmic scale is displayed on a display screen of the equipment and/or output in semi logarithmic graph with the measured data.

Step 13 in FIG. 3 is one example of a step executed by the judging part and the judging part calculates a coefficient(s) of determination (R squared) and compares its magnitude. When the approximation is well satisfied, the cause of deposition of foreign particles can be specified (targeted) by referring to other analytical results. These steps are repeated every interval between cleanings.

Step 14 in FIG. 3 is one example of a step executed by the judging part. The judging part may relate an accumulated amount of etching T to processed date D, and predicts an accumulated amount of etching Tc and date of next cleaning Dc by substituting an upper limitation Yc of number of foreign particles Y into the exponential equation. Or the judging part can calculate past date of cleaning by substituting a lower limitation Ywo of number of foreign particles Y into the exponential equation.

Step 15 in FIG. 3 is one example of a step executed by the data memory part and the display (output) part shown in FIG. 2. A relational data T and Y are sequentially stored in the data memory part. The judging part compares the stored data with last or past related data and the display (output) part can display and output the results of judgment executed by the judging part, such as a judgment of sufficiency of the cleaning and the presence or absence of abnormality of the device, prediction of a lifetime of the device, influences between related devices and information of date and content of a work at an adjacent device.

When data which cannot be approximated by the functional equation is obtained, to the contrary, it can be estimated that something abnormal or different event has occurred. In this case the functional approximation part approximates the data using other mathematical functions and the judging part can estimate the cause or the abnormal event.

Figure 13:
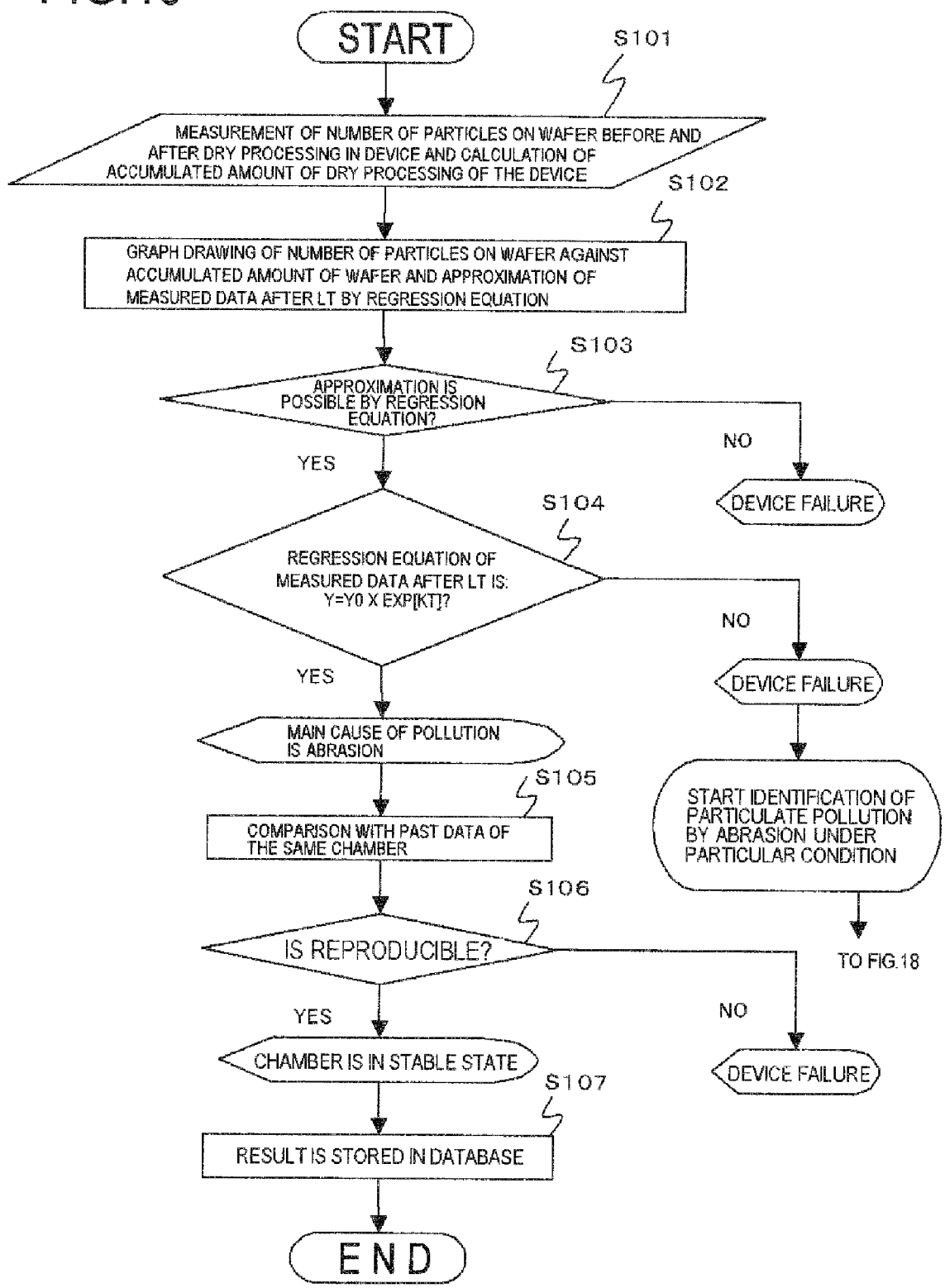
FIG. 13 is a basic flowchart for identification of wafer pollution using data after predetermined amount of etching.

FIGS. 13-17 show examples of estimation flowcharts. FIG. 13 is a basic flowchart for identification of wafer pollution using data after predetermined amount of etching. First, numbers of foreign particles deposited after processing and accumulated amounts of etching are calculated (step S101). Next, the data are approximated using a regression equation of approximation (step S102). At this time, only the data after predetermined accumulated amount of etching (LT) determined based on the past record of each device are used for the regression analysis. If a regression equation can be derived (YES at S103), then go to step S104 and if a regression equation cannot be derived (NO at S103), a failure of the processing device is estimated. At step S104, it is judged whether the equation can be approximated by an exponential equation. If YES at step S104, it is estimated that the main cause of foreign particles pollution is abrasion (detachment) of a deposit and the data is compared with past data of the same chamber (step S105) and judged whether reproducibility (the same tendency) is seen or not (step S106). If YES at step S106, the chamber is judged that it is in a stable state and the result is stored in a database (step S107) and the flow of the steps ends. If NO at step S106, a failure of the device is estimated. When the equation cannot be approximated by an exponential equation (NO at S104), a failure of the device is estimated and go to a flowchart for identification of particulate pollution by abrasion (detachment) of the deposit under particular condition (shown in FIG. 18).

Figure 14:
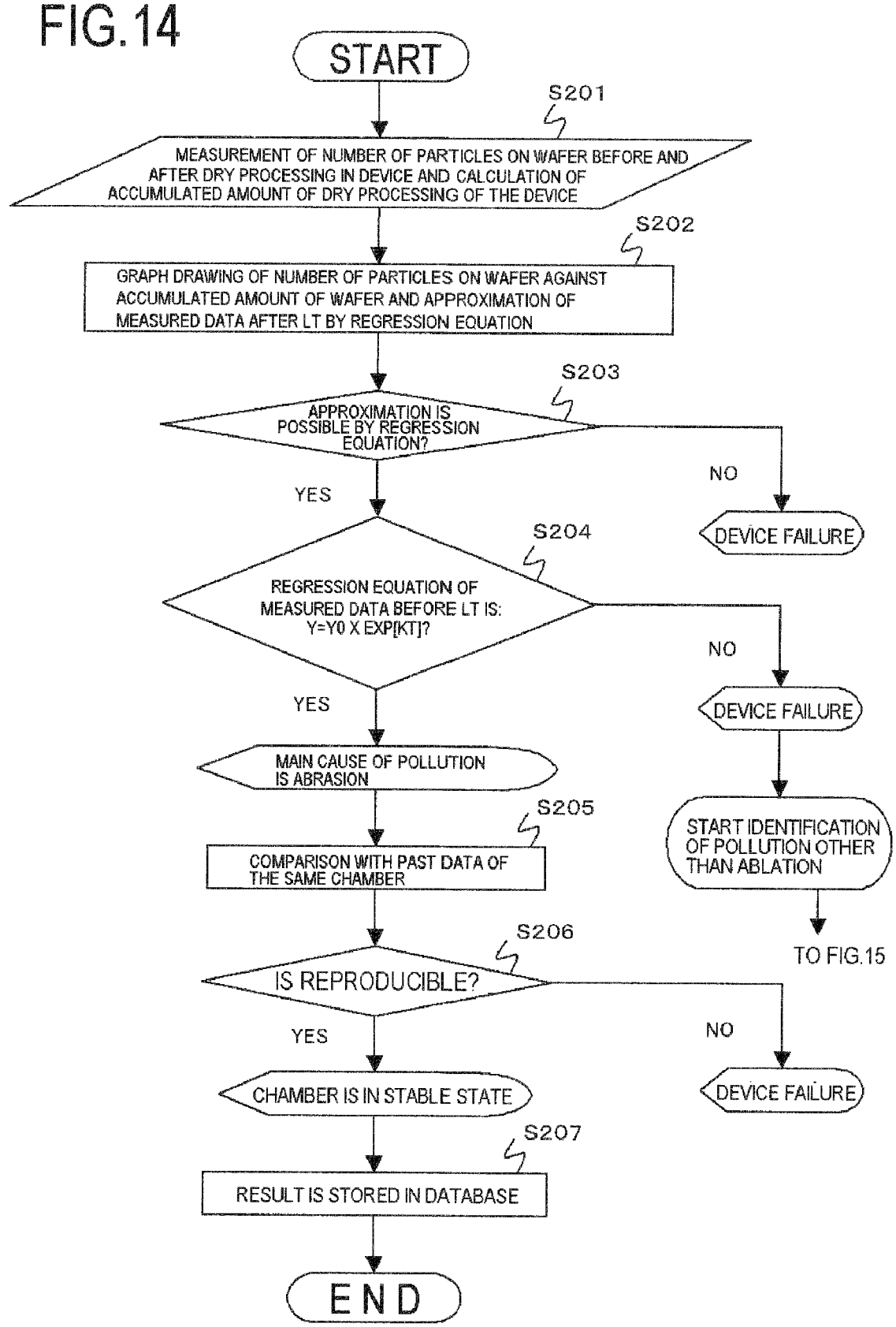
FIG. 14 is a basic flowchart for identification of wafer pollution using data before predetermined amount of etching.

FIG. 14 is a basic flowchart for identification of wafer pollution using data before predetermined amount of etching. First, numbers of foreign particles deposited after processing and accumulated amounts of etching are calculated (step S201), as is explained in the explanation of FIG. 13. Next, the data are approximated using a regression equation (step S202). Different from FIG. 13, only the data before predetermined accumulated amount of etching (LT) determined based on the past record of each device are used for the regression analysis. If a regression equation can be derived (YES at S203), go to step S204 and if a regression equation cannot be derived (NO at step S203), a failure of the processing device is estimated. Next, it is judged whether the equation can be approximated by an exponential equation at step S204. If YES at step S204, it is estimated that the main cause of particulate pollution is abrasion (detachment) of a deposit and the data is compared with past data of the same chamber (step S205) and judged whether reproducibility (the same tendency) is seen or not (step S206). If YES at step S206, it is estimated that the chamber is in a stable state and the result is stored in a database (step S207) and the flow of the steps ends. If NO at step S206, a failure of the device is estimated. When the equation cannot be approximated by an exponential equation (NO at S204), a failure of the device is estimated and go to a flowchart for identification of particulate pollution caused by other than the abrasion (detachment) of the deposit (shown in FIG. 15).

Figure 15:
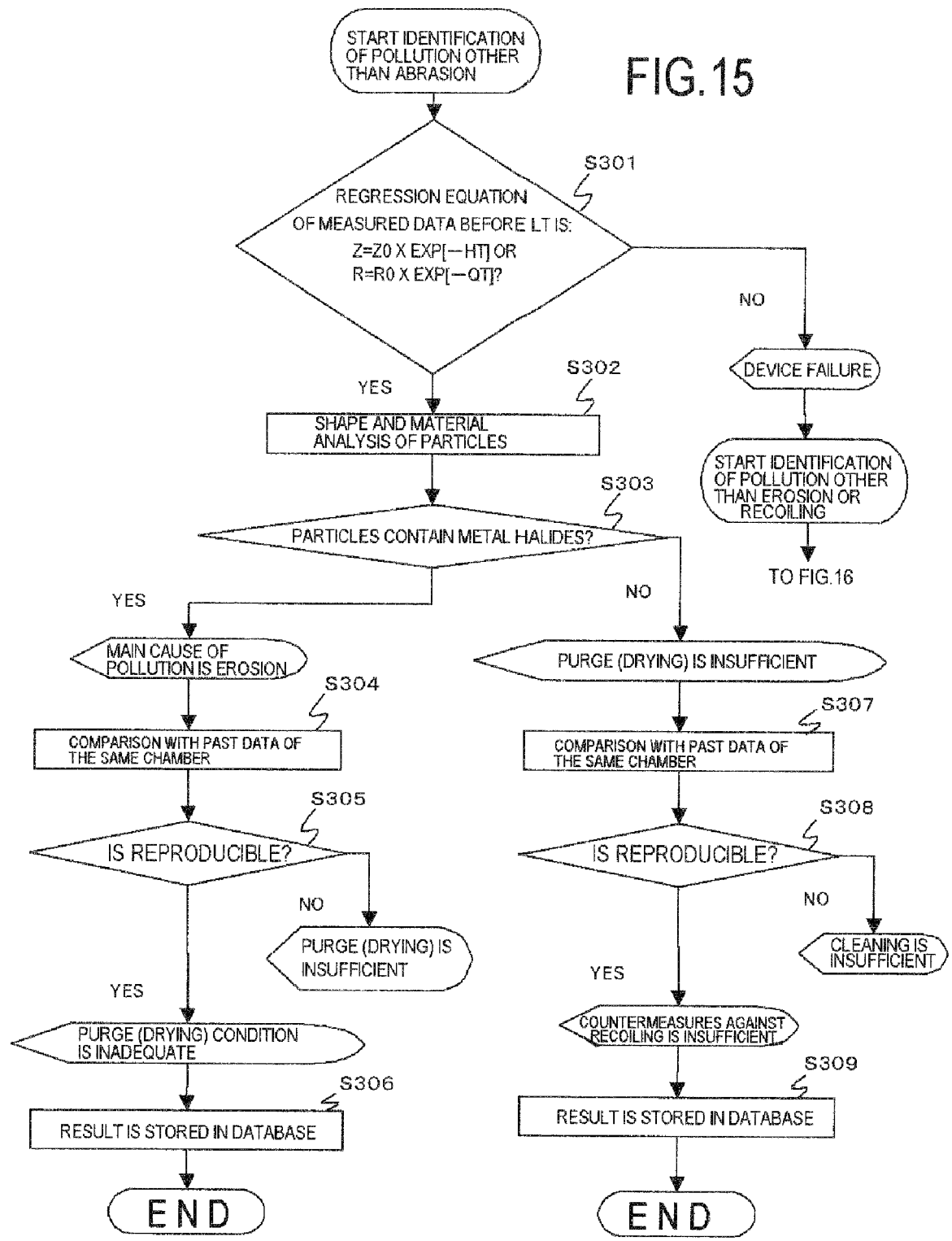
FIG. 15 is a flowchart for identification of wafer pollution when pollution other than abrasion of a deposit is predicted by the steps shown in FIG. 14.
Figure 16:
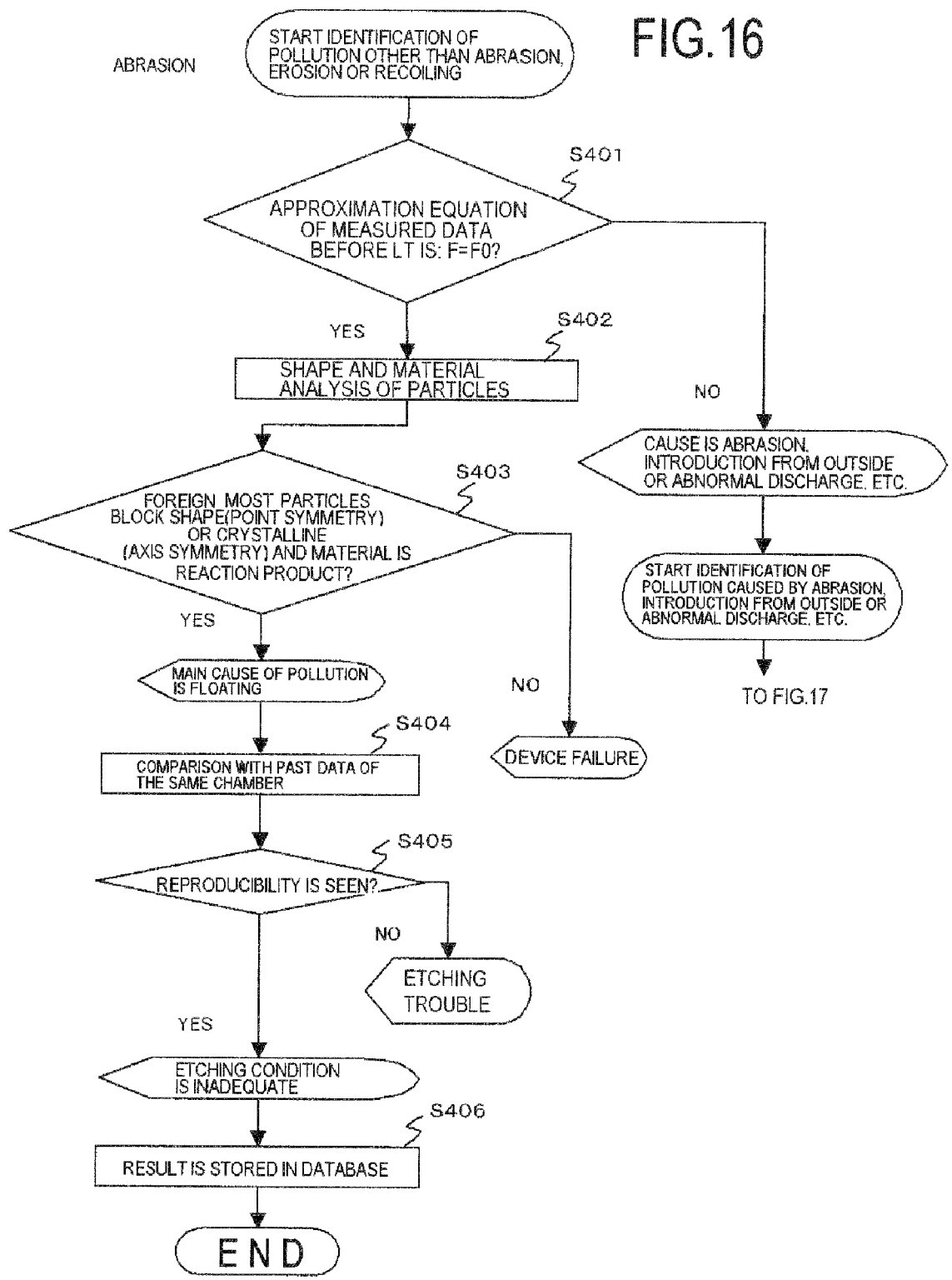
FIG. 16 is a flowchart for identification of wafer pollution when pollution other than erosion or recoiling is predicted by the steps shown in FIG. 15.

FIG. 15 is a flowchart for identification of wafer pollution when particulate pollution caused by other than the abrasion (detachment) of the deposit is predicted by the steps shown in FIG. 14. First, it is judged whether the measured data before LT can be approximated by an exponential equation having a negative exponent (step S301). If NO at step S301, a failure of the device is estimated and other causes of pollution than erosion or recoiling will be considered. In this case, an identification flowchart shown in FIG. 16 is used. If the measured data before LT can be approximated by the exponential equation having a negative exponent (YES at S301), additional analysis in regard to a shape and a material (composition or components) of the foreign particles is executed (step S302) and judged whether the foreign particles contain metal halides or not (step S303). If the foreign particles contain metal halides (YES at S303), it is judged that the main cause of pollution is erosion and the data is compared with past data of the same chamber (step S304) and judged whether the reproducibility (the same tendency) is seen or not (step S305). If the reproducibility (the same tendency) is seen (YES at S305), it is estimated that a purge (drying) condition is inadequate and the result is stored in a database (step S306) and the flow of the steps ends. If the reproducibility (the same tendency) is not seen (NO at S305), it is estimated that the purge (drying) is insufficient.

If the foreign particles do not contain metal halides (NO at S303), it is estimated that the main cause of the pollution may be recoiling, and the data is compared with the past data of the same chamber (step S307) and judged whether the reproducibility (the same tendency) is seen or not (step S308). If reproducibility (the same tendency) is seen (YES at S308), it is estimated that countermeasures against recoiling may be insufficient and certain countermeasures may be taken. The result is then stored in a database (step S309) and the flow of the steps ends. If the reproducibility (the same tendency) is not seen (NO at S308), it is estimated that the cleaning may be insufficient.

FIG. 16 is a flowchart for identification of wafer pollution when pollution other than erosion or recoiling is predicted by the steps shown in FIG. 15. First, it is judged whether measured data before LT can be approximated by $F=F_0$ (step S401). If NO at S401, it is estimated that the cause may be abrasion, introduction from outside or an abnormal discharge, etc. and then go to steps shown in FIG. 17 to start identification of the pollution caused by abrasion, introduction from outside or an abnormal discharge, and so on. If YES at S401, an additional analysis in regard to the shape and material (composition or components) of the foreign particles is executed (step S402) and judged whether the most foreign particles have an agglomerate or block (point symmetry) shape or crystalline (axis symmetry) and the material of the particles is a reaction product or not (step S403). If NO at S403, a failure of the device is estimated and if YES at S403, it is estimated that the cause may be floating foreign particles and the data is compared with the past data of the same chamber (step S404) and then judged whether the reproducibility (the same tendency) is seen or not (step S405). If NO at S405, it is judged as an etching trouble. If YES at S405, it is judged that the etching condition is inadequate and the result is stored in a database (step S406) and the flow of the steps ends.

Figure 17:
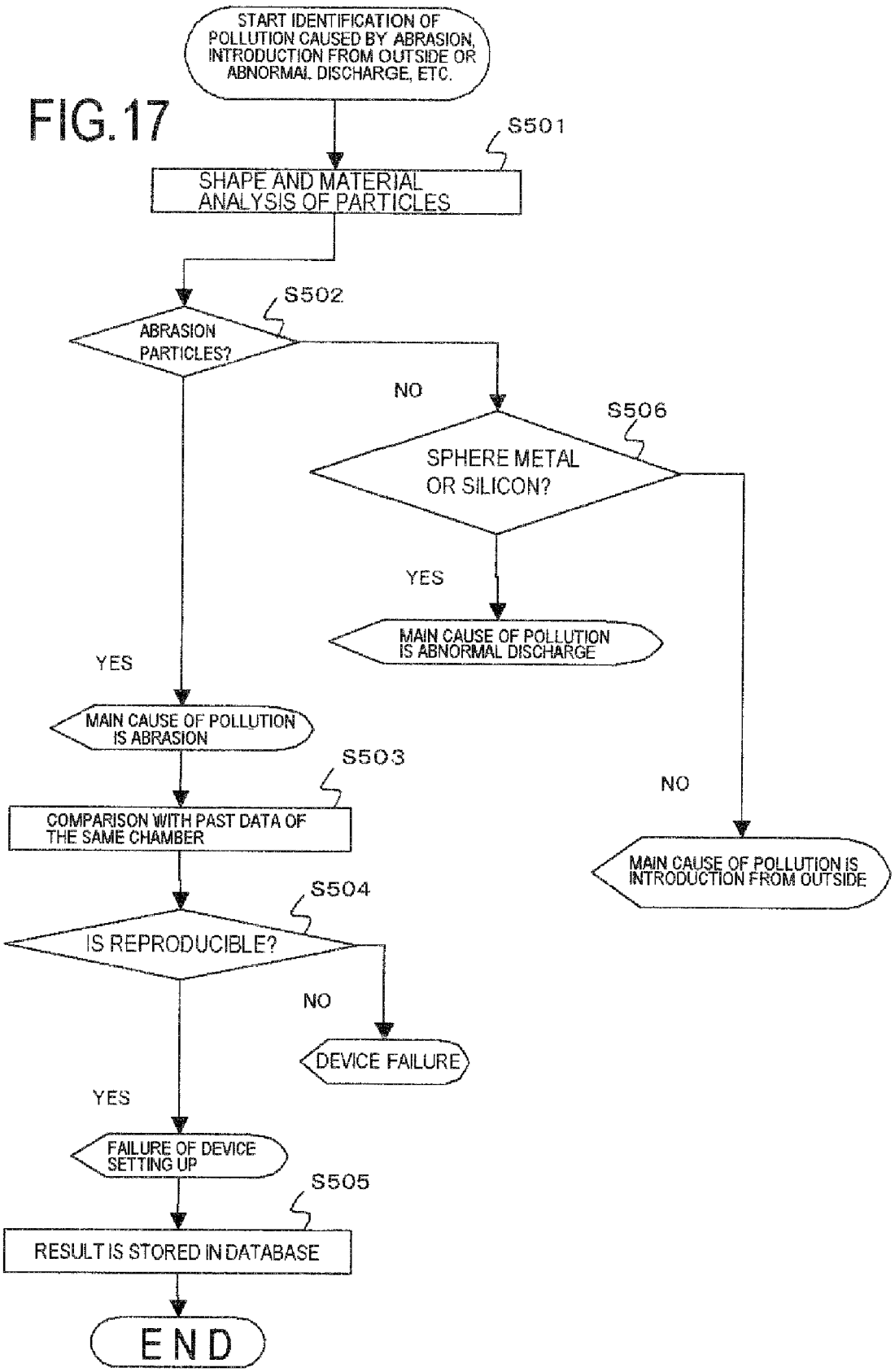
FIG. 17 is a flowchart for identification of wafer pollution when pollution by abrasion, introduction from outside or abnormal discharge is predicted by the steps shown in FIG. 16.

FIG. 17 is a flowchart for identification of wafer pollution when pollution by abrasion, introduction from outside or abnormal discharge is predicted by the steps shown in FIG. 16. First, an analysis of foreign particles in regard to the shape and material (composition or components) is executed (step S501) and judged whether the foreign particles are abrasion particles (worn debris) or not (step S502). If YES at S502, it is judged that the main cause of the pollution is abrasion and the data is compared with the past data of the same chamber (step S503) and then judged whether reproducibility (the same tendency) is seen or not (step S504). If NO at S504, a failure of the device is estimated and if YES at S504, it is judged that the cause may be a failure of setting up of the device. Then the result is stored in a database (step S505) and the flow of the steps ends. If the foreign particles are not abrasion particles (NO at S502), it is judged whether the foreign particles are made of sphere metal or silicon (step S506) and if YES at S506, it is estimated that the main cause of the pollution may be an abnormal discharge and if NO at S506, it is estimated that the main cause of the pollution may be an introduction from outside.

FIG. 18 is a flowchart for identification of wafer pollution when pollution by abrasion (detachment) of a deposition under a particular condition is predicted by the steps shown in FIG. 13. In this case it is judged whether the measured data after LT can be extrapolated by the regression exponential equation of the last processing period immediately preceding the last cleaning (step S601). If YES at S601, it is estimated that the cleaning is insufficient. Then the data is compared with the past data of the same chamber (step S602) and judged whether the reproducibility (the same tendency) is seen or not (step S603). If NO at S603, it is estimated that the cause may be a failure of the cleaning. If YES at S603, it is estimated that a cleaning manual is inadequate and then the result is stored in a database (step S604) and the flow of the steps ends. If the measured data after LT cannot be extrapolated by the regression exponential equation of the last processing period immediately preceding the last cleaning (NO at S601), it is judged whether the measured values after LT are largely different before and after cleaning of an adjacent chamber (step S605). If YES at S605, it is estimated that the cause of the pollution may be an inter-pollution between adjacent chambers and if NO at S605, a failure of the device is estimated.

The present invention can be adapted to various modes using a part or all of the preceding methods or equipments described and some exemplary embodiment embodiments are explained as examples which are not limitative.

EXAMPLE 1

Figure 4:
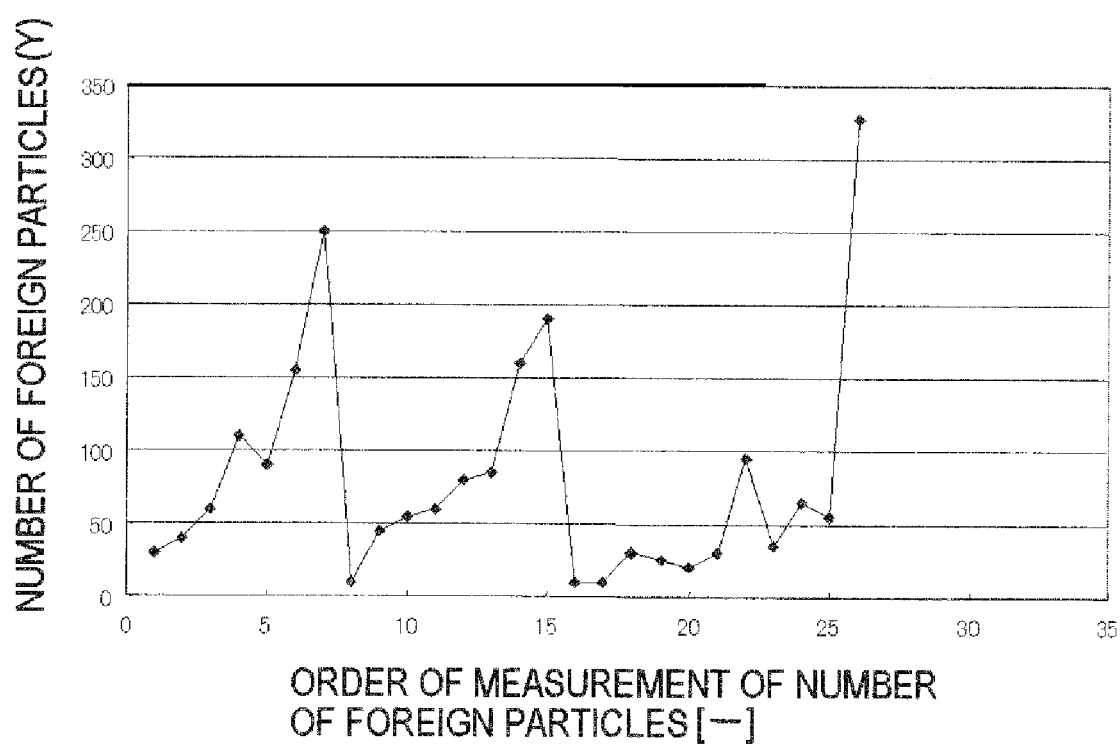
FIG. 4 is a graph showing a relation of number of foreign particles (Y) arranged in a processed order.
Figure 5:
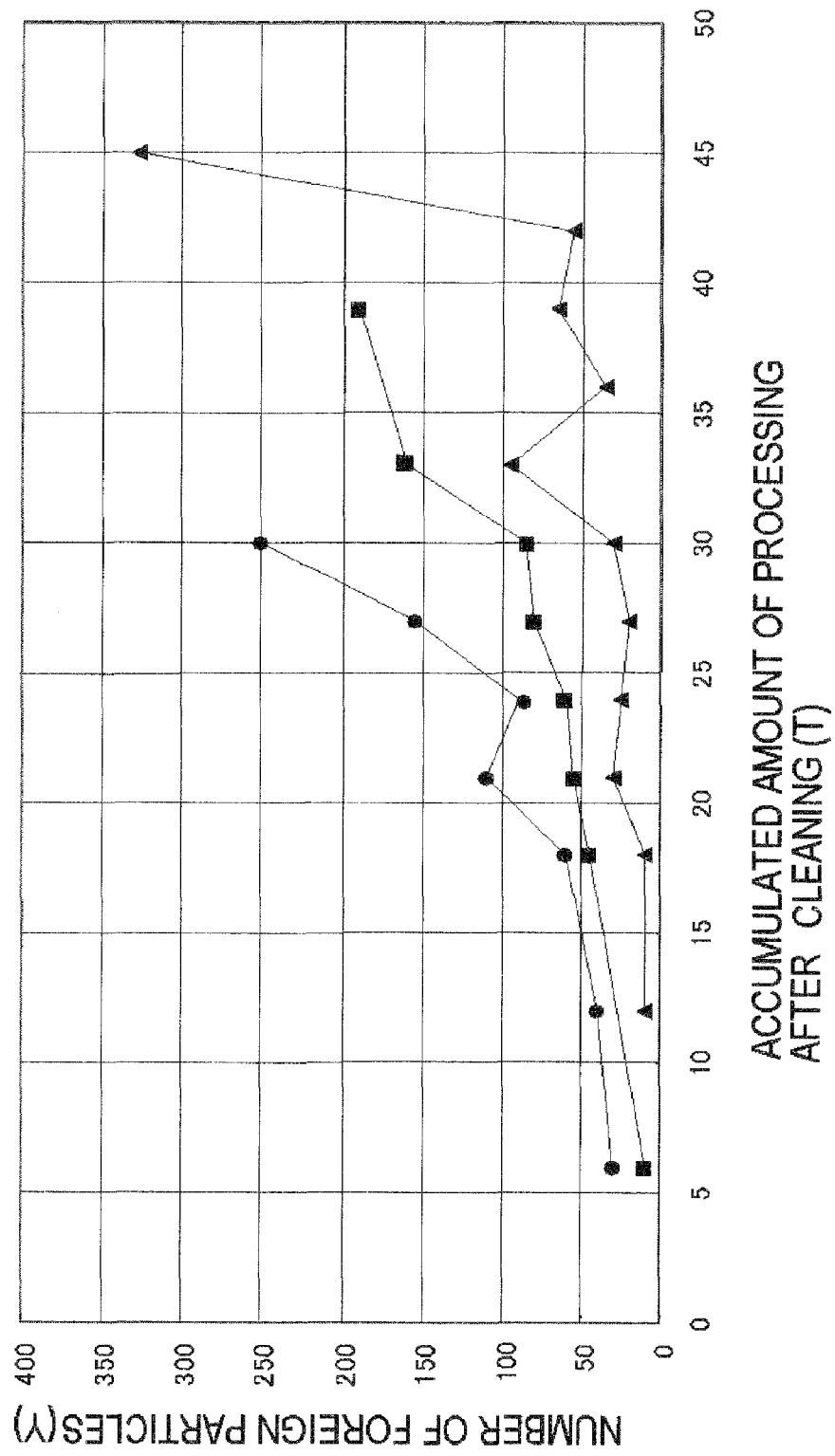
FIG. 5 is a graph in which the axis of abscissas of FIG. 4 is substituted by amount of etching (accumulated amount of etching after cleaning of a device)
Figure 6:
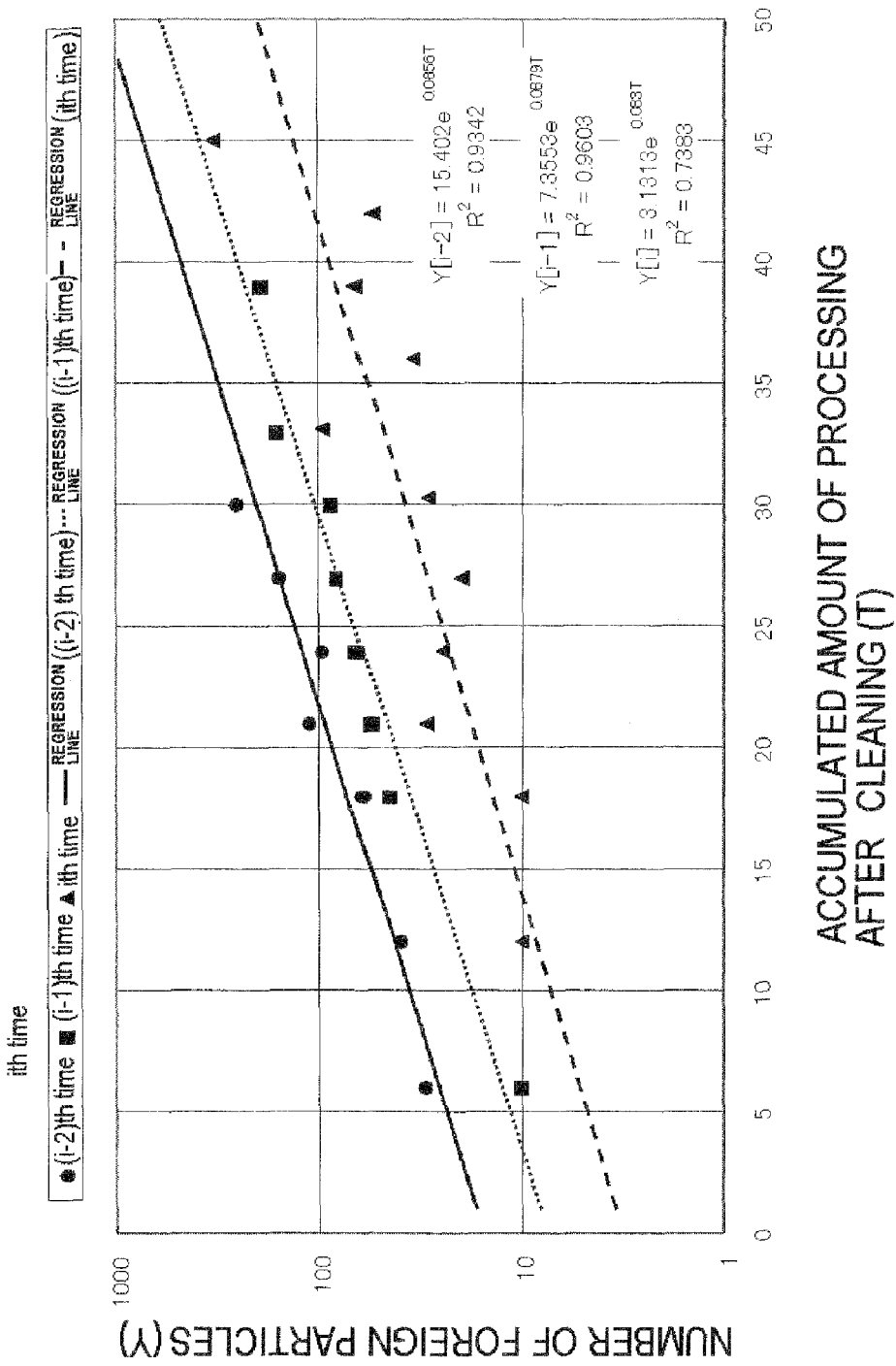
FIG. 6 is a graph in which the axis of ordinates of FIG. 5 is substituted by logarithmic scale.

FIGS. 4 to 6 are graphs showing tendencies of particulate pollution on a surface of a semiconductor substrate during a dry etching process. Y denotes the number of foreign particles and the value was calculated by subtracting a number of foreign particles counted on a substrate by an inspection device (KLA-Tencor corp., US, for example) after etching from a number of foreign particles counted on the substrate before etching. Those particles larger or smaller than the predetermined range were not counted to exclude an influence of shape distribution of the foreign particles.

FIG. 4 is a graph showing a relation of the number of foreign particles (Y) arranged in a processed order. In case where data sampling periods of the foreign particles are not constant, the abscissa of the graph is not proportional to the accumulated amount of etching, and the scale of the abscissa is not proportional to the amount of etching. Therefore, it is difficult to find the relation between the number of foreign particles and the accumulated amount of etching. When the abscissa is production lot and the ordinate is number of foreign particles in this lot, for example, the same problem occurs when an accumulated amount is not proportional to interval of counting (data sampling of) the foreign particles due to using different devices for each lot, for example.

FIG. 5 is a graph, the axis of abscissa of FIG. 4 is substituted by an amount of etching T (accumulated amount of etching after cleaning of a device). The data of three cycles (periods) between cleanings are shown and the numbers of foreign particles are reduced and initialized after cleaning in every cycle (period). However, an increasing speed is different for each cycle (period) and it is difficult to judge whether the reproducibility (the same tendency) can be found or not.

Although T corresponds to an accumulated amount of etching, an amount of substrates as a material, an amount of etching gas, an applied time of electro magnetic wave or a heating time of substrates to supply necessary energy for the etching when etching condition is constant. Time or days for etching can be employed when an amount of etching per unit time is constant.

FIG. 6 is a graph in which the axis of ordinate of FIG. 5 is substituted by a logarithmic scale. By comparison of regression equations and coefficient(s) of determination (R squared) of the equations, we can see that the initial values $Y_0$ are different from one cycle (period) to other but the gradient (inclination) K (exponent of the exponential equation) are close to each other, i.e., show a high reproducibility. The coefficient of determination ranges between 0 and 1 and the nearer to 1 means the higher the accuracy of the approximation is.

According to the regression analysis, we found that the relation of the number of foreign particles Y deposited on the semiconductor substrate during an etching process plotted against the accumulated amount of etching T after cleaning can be approximated to an exponential equation $Y=Y_0 \times EXP[K \times T]$, and the initial value $Y_0$ fluctuate after every cleaning.

When the increasing speed (dY/dT) is proportional to Y itself, the relation is known as an initial value problem as follows:

$$dY/dT = K \times Y$$

$$(1/Y)dY = K \times dT$$

$$\ln Y = K \times T + C$$

$$Y = Y_0 \times EXP[K \times T],$$

where dY is a difference in dT, K and C are constants, $Y_0$ is initial value of Y at T=0 and EXP[ ] is a power of base e of natural logarithm.

It is apparent that the pollution phenomena in the processing device which produces particulate deposit can be approximated by the regression equation in FIG. 6. Therefore, the pollution phenomena can be explained as follows.

First, fine foreign particles occurred during a processing by the device are build up and deposited on a wall of the chamber. Next, the deposited fine foreign particles on the wall are increased according as the accumulated processed amount is increased. Taking into account that abrasion (detached) particles will increase in proportional to the amount of the deposited fine particles on the chamber wall in a direction normal to the wall, an increasing speed of the abrasion (detached) particles is proportional to the amount of the deposited fine particles. When the chamber is cleaned, the number of deposited foreign particles is small just after the cleaning, because the deposition film is removed.

This assumption can explain the fact that the relation between the number of foreign particles Y and the amount of etching T is approximated by a first differential equation and that the value of Y is initialized after cleaning. It can be whether the foreign particles are abrasion (detached) particles or not by following consideration.

For example, when a binding strength between a surface of the wall and the small particles is very small compared to a binding strength between the fine particles, large abrasion (detached) particles are not produced because the fine particles cannot be deposited on the wall. When a binding strength between a surface of the wall and the fine particles is very large compared to a binding strength between the fine particles, no abrasion (detached) particle is produced because the fine particles cannot be detached from the wall. And when a binding strength between the fine particles is small, no large abrasion (detached) particle is produced.

That is, a detached place of the particle can be specified because the detached place depends on the combination of the fine particles and a material of the surface of the device. And the abrasion (detached) particles can be identified among the deposited foreign particles because when the fine particles are combined and grow in the air, the shape of the foreign particles becomes agglomerate-block or crystalline and when the fine particles are combined or deposited on the surface of the wall, the shape of the foreign particles usually becomes scale-like or amorphous.

EXAMPLE 2

A second example of the present invention is explained in situations that a film forming device such as CVD (Chemical Vapor Deposition) is used. The device comprises a vacuum chamber, an evacuation device, gas components introducing device, power supply for reaction and transportation device of a substrate to be processed. The CVD device differs from the etching device in the point that the CVD device makes the growth of a film of vapor deposition on the surface of the substrate and, on the other hand, the dry etching device etches the surface of the substrate.

Figure 7:
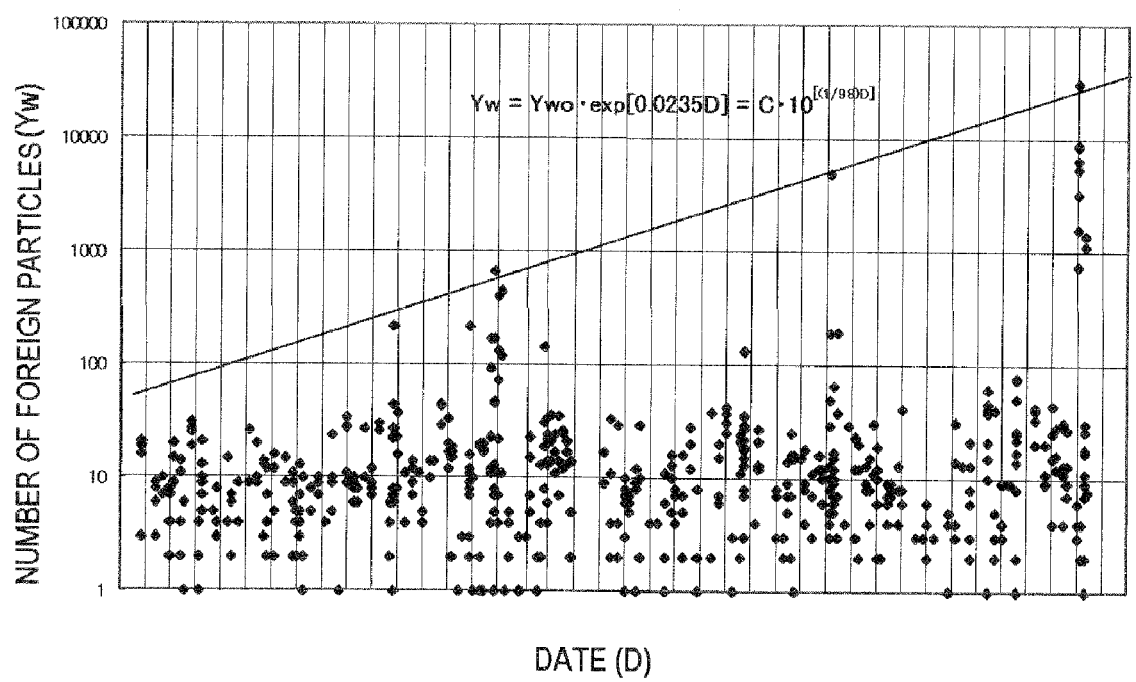
FIG. 7 is a semi-logarithmic graph showing a relation of number of foreign particles and date/time of CVD processing.

FIG. 7 shows a tendency of the particulate pollution on the surface of the semiconductor substrate in the CVD device. The number of foreign particles was calculated by subtracting a number of foreign particles counted on a substrate by an inspection device (KLA-Tencor corp., US, for example) after a CVD process from a number of foreign particles counted on the substrate before the CVD process. Those particles larger or smaller than the predetermined range were not counted to exclude an influence of shape distribution of the particles (i.e., shape-dependent influence).

FIG. 7 is a semi-logarithmic graph showing the number of foreign particles plotted in order of date/time of the CVD processing. Generally, a reaction chamber of the CVD device is replaced for a new one instead of cleaning of the polluted chamber. FIG. 7 shows the data of more than ten times of CVD processing after the replacement and there is no initialization after each replacement.

It should be noted that the number of foreign particles are less than one hundred in most process cycle (period) after the replacement; however, there are occasions where the data more than one hundred foreign particles are counted unexpectedly.

A group of the unexpected data is regarded as a different group of data in which the number of the particles is less than one hundred. Then a relation of the number of foreign particles Yw and processed date D in the unexpected group is approximated by an exponential function:

$$Yw = Yw_0 \times EXP[G \times D],$$

where $Yw_0$ is an initial value and positive constant, $EXP[\ ]$ is a exponent of the base e of natural logarithm, and G is a gradient of the exponential function drawn in the semi-logarithmic graph of D and Yw and positive constant.

This mathematical model means that the pollution is regarded to relate to the phenomenon of abrasion of the deposit as is the case of the etching process. In addition, the data is the unexpected data which differs from the group of normal data in the CVD device. Therefore, this pollution phenomenon can be explained that particles accumulated for a long time around the reaction chamber of the CVD device is detached by a sudden physical impact and flow into the reaction chamber and then deposit on the semiconductor substrate. The fact that the number of foreign particles Yw is not initialized by the replacement of the reaction chamber suggests that the detachment (abrasion) phenomenon occurs around the reaction chamber (not in the reaction chamber itself).

By comparison with the date $D_0$ when 1 or less than 10 is substituted into the initial value $Yw_0$ and a maintenance record of the CVD device, we found a replacement of a component of the device. Since a replacement interval of this component is more than ten times of the replacement interval of the CVD device, the cause of the pollution can be specified as an abrasion (detachment) from the component.

When a relation between the amount of processing and numbers of particles can be approximated as an exponential equation, the method or equipment of the present invention can identify the abrasion phenomenon in the component connected to the reaction chamber of the CVD device as aforementioned.

EXAMPLE 3

A third example of the present invention will be explained taking a processing device (in which deposit will occur,) for instance. In the device, some parts of material-components that should have been evacuated to the outside of the device before processing is remained and pollution occurs caused by the remaining material components during the evacuation proceeds with lapse of time after start of the processing.

In a surface processing device such as a dry etching device, for example, it is known that a foreign material, the main component of which include aluminum fluoride and so on, is produced because water used in a cleaning process and remained in the vacuum chamber promotes chemical reactions between gas containing fluorine atom and alumina or aluminum surface in the device (Non-Patent Document 2).

In addition, it is known that alumina and aluminum surface is eroded by water and chloride ion and produces reaction products whose main component is aluminum hydroxide by textbooks of chemistry or public references of method of fabrication of aluminum electrolytic capacitor.

The moisture on a wall of the vacuum chamber is evacuated by the evacuation equipment and it is known that an evacuation speed of the moisture is proportional to remaining amount of moisture by textbooks of vacuum engineering.

Therefore, the relation between an evacuation speed dy/dt by the evacuator and a remaining amount of the moisture y after cleaning of the chamber can be expressed by a differential equation proportional to y itself:

$$dy/dt = -ky,$$

where t is an evacuation time and k is a positive constant.

Therefore, the pollution phenomenon caused by the erosion material can be approximated by the initial value problem of differential equation by regarding that an amount of foreign material Z caused by erosion mediated by remaining water and deposit on the substrate is proportional to the amount of remaining water y, and that the accumulated evacuation time t is proportional to the accumulated amount of surface processing T after cleaning of the surface processing device.

A model of erosion material differs from a model of an abrasion from deposit in the point that the exponential function is a decreasing function, that is, a coefficient of T is negative. Therefore, the number of particles decreases exponentially in proportion to the amount of processing after cleaning of the device.

$$dZ/dT = -H \times Z$$

$$(1/Z)dZ = -H \times dT$$

$$lnZ = -H \times T + C$$

$$Z = Z_0 \times EXP[-H \times T],$$

where $Z_0$ is an initial value of Z and H is a positive constant.

When the processing device does not produce moisture during the surface processing or film forming process, no erosion material can be produced if the device is dry enough. In other words, if the graph of the number of particles on the surface of substrate plotted against the amount of processing has a feature to decrease exponentially after cleaning, a suggestion is given that an evacuation of the remaining moisture after cleaning was insufficient. And if the erosion material was mainly detected by a componential analysis of the material, it will become evidence of the erosion pollution.

EXAMPLE 4

Another (fourth) example of the present invention will be explained taking a deposit-producing processing device for instance. As an example 3, some parts of component material that should be evacuated to the outside of the device before processing remained and pollution by the component material occurs when the component material is evacuated during the processing in the device.

It is known that foreign particles may flow back from the evacuator of the vacuum chamber to the vacuum chamber, fop example, in the surface processing device or the film forming device (Non-Patent Document 3). Most of these foreign particles originate from re-deposited particles, which have been once flushed out of the vacuum chamber by the cleaning, and thereafter again deposited in a space between the vacuum chamber and the evacuator. These foreign particles have a feature that they are easily transported by a viscous flow of exhausted gas. A binding force of the re-deposition particles to the wall can be negligible compared to that of the deposition material aforementioned.

A part of the re-deposition particles aspirated into the evacuator such as a turbo molecular pump flow back into the vacuum chamber due to recoiling from a rotor in the pump and adhere onto the surface of the substrate.

Assuming that a cross section of an exhaustion outlet from which the foreign particles flow back is a hypothetical wall surface and that the foreign particles are abrasion (detached) particles from the hypothetical wall surface. Then the decreasing speed of the re-deposition particles flowing back from the hypothetical wall surface can be considered to be proportional to remaining amount of the re-deposition particles. Thus the flow back particles can be approximated as an initial value problem of the differential equation as the case of erosion material.

Therefore, in case where the graph of the number of particles on the surface of substrate plotted against the amount of processing shows a feature to decrease exponentially after cleaning, it suggests a possibility that an evacuation of the remained moisture after cleaning was insufficient or the particles are back flow particles from the evacuator. If any ingredient ascribable to erosion is not contained in these foreign particles, it will become evidence showing that the particles are not from the erosion material and therefore, as a result, the possibility that the particles are back flow particles from the evacuator is increased.

EXAMPLE 5

A fifth example will be explained. In this case, a decreasing function model by erosion material or back flow particles from the evacuator and a decreasing function model by abrasion particles are coexistent under competition on a graph of the number of particles on the substrate and the accumulated amount of processing without identifying the components of the particles. When a regression analysis is executed based on the abrasion particles model only, the gradient (coefficient of an exponent) of the exponential graph (equation) will become smaller.

In such a case a composite (synthesized) function of a decreasing function and an increasing function is assumed and both regression functions of the decreasing function and the increasing function can be derived.

As for an increasing function model, assuming that a target (acceptable) number of particles deposited on the substrate (=Ns) is 55 (LMT(standards of limitation of the particles)=70 minus safety margin 15), a number of substrates to be processed before the number of the particles reaches the Ns (=Xs) is 5000, and initial value of the particles after cleaning (=$Y_0$) is 5, then based on a increasing function $Y=Y_0 \times EXP[K \times X]$, the Ns and K are calculated as follows:

$$Ns = Y_0 \times EXP[K \times Xs]$$

$$K = [ln(Ns/Y_0)]/Xs = [ln(55/5)]/5000 \approx \text{(nearly equal to)} 4.7958 \times 10^{-4},$$

and therefore, the number of particles Y is given by the following increasing function, $$Y = 5 \, EXP[(4.7958 \times 10^{-4})X].$$

As for a decreasing function in consideration of the increasing function, assuming that the number of acceptable particles including an increasing number and a decreasing number after processing of 500 substrates is about 10, the composite function is expressed as follows using $Z_0 = 50$ (=$Ns - Y_0$), $$\begin{aligned} N &= Y + Z \\ &= Y_0 \times EXP[K \times X] + Z_0 \times EXP[-H \times X] \\ &= 5EXP[(4.7958 \times 10^{-4})(500)] + 50EXP[-500H] \\ &= 10. \end{aligned}$$

Then H is nearly equal to $5.2373 \times 10^{-3}$. Therefore, the decreasing function is expressed as follows:

$$Z \leq 50 \, EXP[(-5.2373 \times 10^{-3})X]$$

Therefore, the number of the foreign particles when the decreasing model and the increasing model are copresent is expressed as follows (FIG. 8):

$N=Y+Z=5 \text{ EXP}[(4.7958\times10^{-4})X]+50 \text{ EXP}[(-5.2373\times10^{-3})X]$.

This graph will be effective to estimate quality of cleaning of the devices, conditions of evacuation of component materials or an abnormal state of the devices.

EXAMPLE 6

A sixth example in which a plurality of vacuum chambers are provided in the processing device is explained. The processing device comprises two processing chambers A and B, and one transfer chamber T as a plurality of vacuum chambers, for example. The substrates transferred via transportation device are brought into the processing chamber A or B via the transfer chamber T. After processing of the substrates, the substrates are transferred to the transportation device via the transfer chamber T. Connecting tubes between the transfer chamber T, the processing chambers A and B, and the transportation device can be closed or opened by a gate valve and the inner pressure can be also controlled.

The structure is popular for a commercial dry etching device or CVD device. The advantage of the structure is that when one processing device is in cleaning, the other processing device can be utilized continuously.

However, there is a problem that there may be a possibility of inter-device pollution, i.e., pollution caused between device and device. For example, even when one processing chamber is opened for cleaning, a transfer chamber T which is under use for an other processing chamber cannot be opened because the other processing chamber is used. Therefore, a cleaning frequency of the transfer chamber T is decreased compared to the processing chamber. As for the gate valve, a cleaning frequency of side walls which do not face to the processing chamber or face to the transfer chamber T is decreased, too. It is difficult to clean a region around the closed gate valve, foreign particles tend to deposit on the region.

When the gate valve is opened or closed, unless the difference of the pressure between the processing chamber and the transfer chamber T is not controlled adequately, subsequent substrates may be polluted due to incoming foreign particles or remaining gas components from the processing chamber into the transfer chamber T. In some combinations of the remaining gas and materials inside the transfer chamber cause erosion inside the transfer chamber T and the erosion particles deposit on the surface of the substrates. When using both two processing chambers at the same time, the substrates to be processed are usually processed in any one of the chambers A and B, alternately.

When inter-device pollution occurred, the graph of foreign particles on the substrate plotted against accumulated amount of processing shows a distinctive change. That is, the deposited particles in the processing chamber A, for example, increase exponentially (i.e., approximately according to the exponential function) after cleaning of the chamber A; however, the initial value becomes larger than usual. Thereafter, the value tends to become normal after cleaning of the chamber B.

Figure 9:
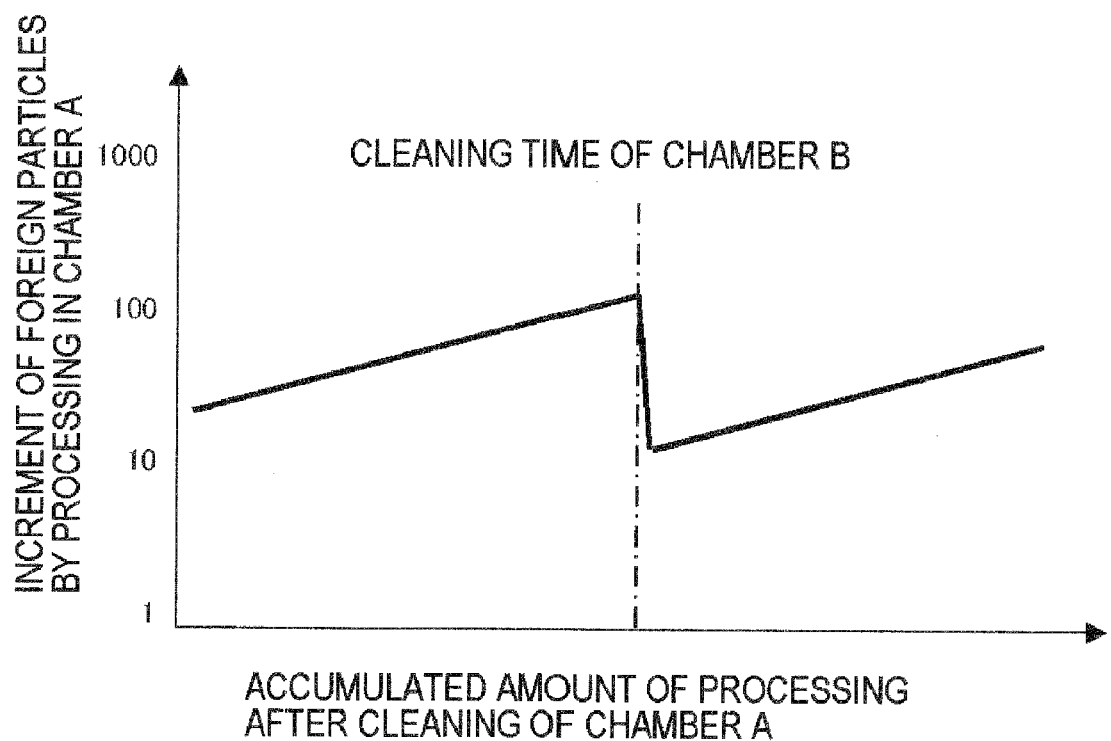
FIG. 9 is a graph showing an example of a relation of numbers of foreign particles and accumulated amount of etching, and an influence of inter-device pollution.

The reason is as follows. When the cleaning periods of both processing chambers are different each other, the transfer chamber T is affected by the polluted processing chamber B, because just after cleaning of the processing chamber A, the chamber B is in a more polluted condition and period than the processing chamber A. Therefore, the substrates transported into the processing chamber A via the transfer chamber T are strongly affected by the pollution in the processing chamber B. This influence increases exponentially until the processing chamber B is cleaned (FIG. 9).

Therefore, in the case where the processing device has a plurality of processing chambers, the existence of inter-pollution between the processing chambers can be detected by associating the graph of the deposited particles on the substrate in one processing chamber plotted versus the accumulated amount of processing with the cleaning time of the other processing chamber.

EXAMPLE 7

A seventh example relates to the fifth example. In the instant example, measured values obtained before the accumulated value of processing reaches a predetermined value are excluded for approximation (regression) of the increasing (function) type for the purpose of confirming the reproducibility (the same tendency) of the abrasion phenomenon of deposit as an increasing model.

The abrasion phenomenon usually occurs in a device which produces a deposit during processing. However, it is presumed that erosion or back flow from an evacuator occurs unexpectedly only when a pollution control is insufficient.

Figure 8:
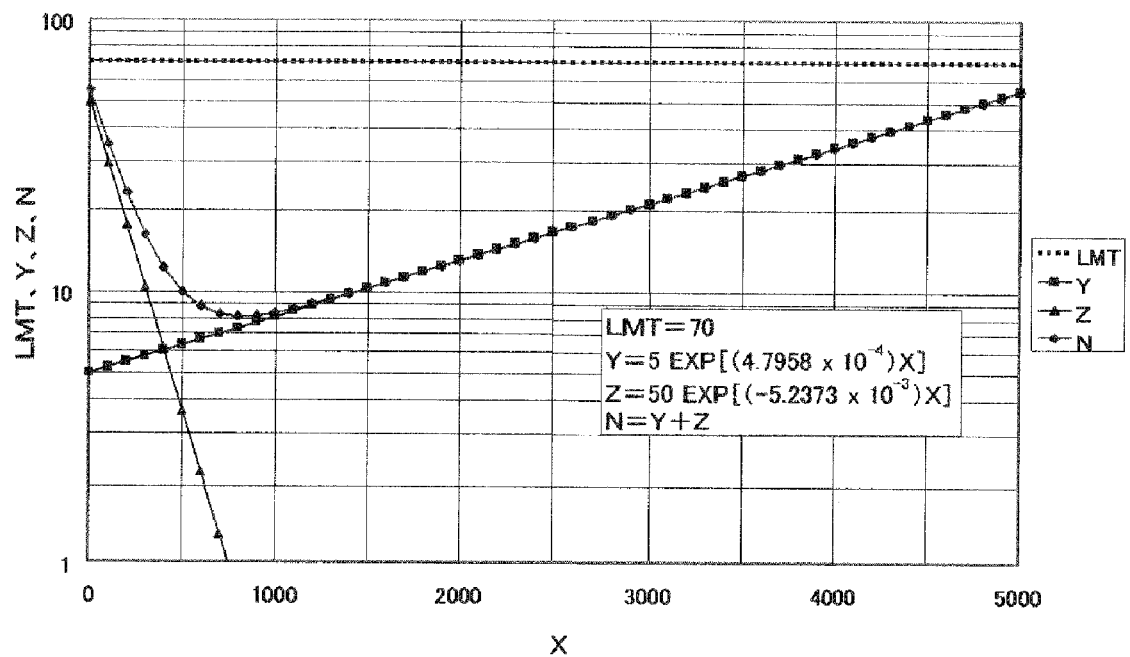
FIG. 8 is a semi-logarithmic graph showing an example of decreasing-type function (Z), increasing-type function (Y) and composite function (N) thereof.

A composite (synthesized) graph of the decreasing model and the increasing model becomes a curve convex directed to the lower side (FIG. 8). In this case, a real capacity of the processing device can be controlled or monitored without influence of erosion, back flow from an evacuator or an existence of the particles-decreasing-type troubles using an approximation function obtained by using measured data more than or equal to Xth, which is a predetermined accumulated amount of processing (X) having a margin against the lowest point of the graph in FIG. 8 (the Xth is 1000, for example).

An upper limit for measured data can be set before reaching (i.e., below) the value Xth. Thereby, the pollution control can be performed by judging that a decreasing-type trouble is determined when a measured value exceeded the upper limit.

EXAMPLE 8

An eighth example of the present invention relates to a strategy of an analysis of foreign particles. Conventionally, an analysis of foreign particles has been conducted for substrates whose foreign particles deposited exceed a control value. However, our experiences suggest that most of the foreign particles deposited during a stable process are ascribable to abrasion (detaching). Therefore, it is useless to analyze the particles for the shape and material in detail for the substrates whose foreign particles deposited exceed a control value, 200 for example, because it is only re-confirmation that the particles are abrasion (detached) particles although such analysis needs much effort. Rather, it would be preferred to analyze foreign particles at an earlier time after cleaning of a device.

Figure 10:
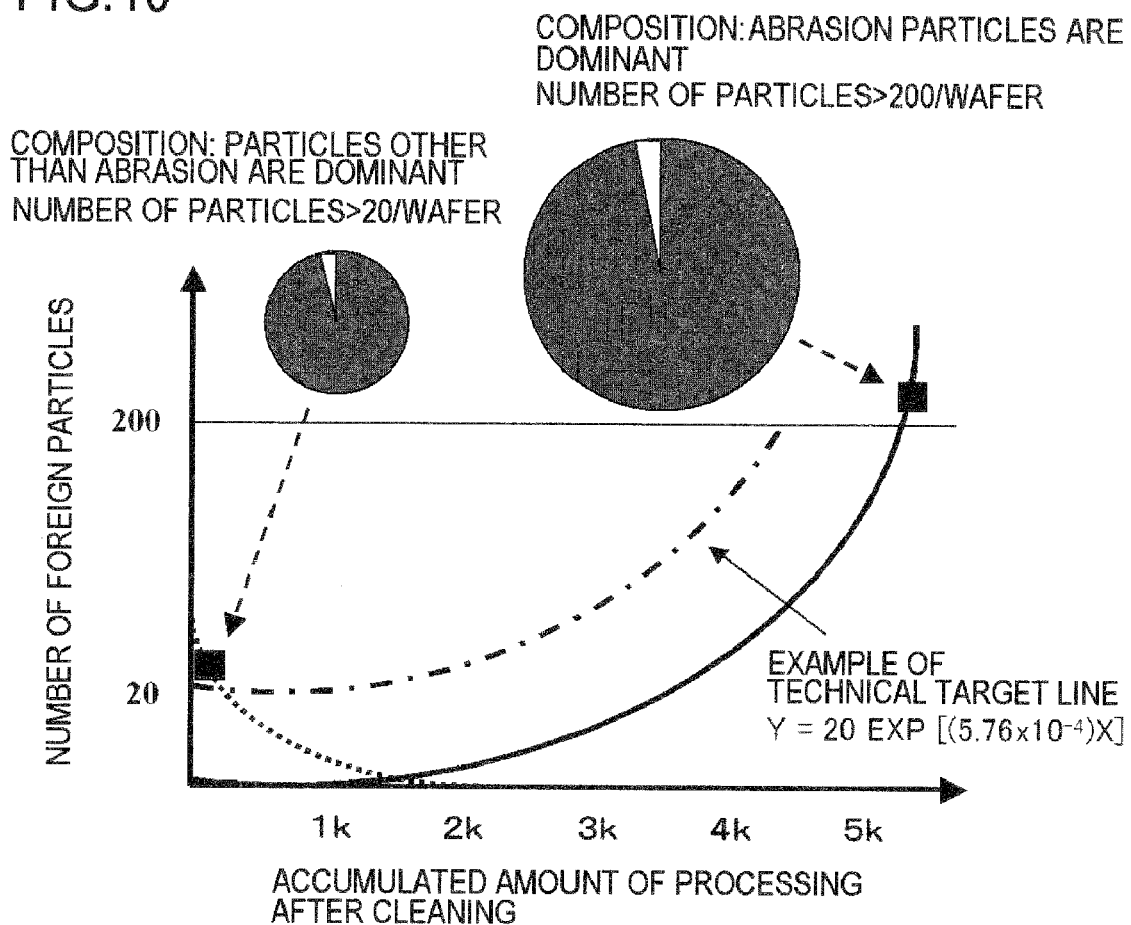
FIG. 10 shows a relation of deposited foreign particles on a substrate and accumulated amount of etching after cleaning of a device, and one example of contents of the foreign particles.

Suppose that a limit value of the particles earlier after cleaning is 20, for example, and detailed analysis of the particles exceeding the limit value for a shape and a material would be efficient even with slight effort because the particles may be identified as caused by other than abrasion of deposited particles with a high possibility (FIG. 10).

EXAMPLE 9

A ninth example of the present invention relates to a management standard of foreign particles. Conventionally, no tolerance for the gradient (inclination) of the standard (limitation) line was needed based on the prerequisite that the standard line be horizontal (no gradient). Therefore, only a tolerance of a level of measured values was set in the conventional management system.

Figure 11:
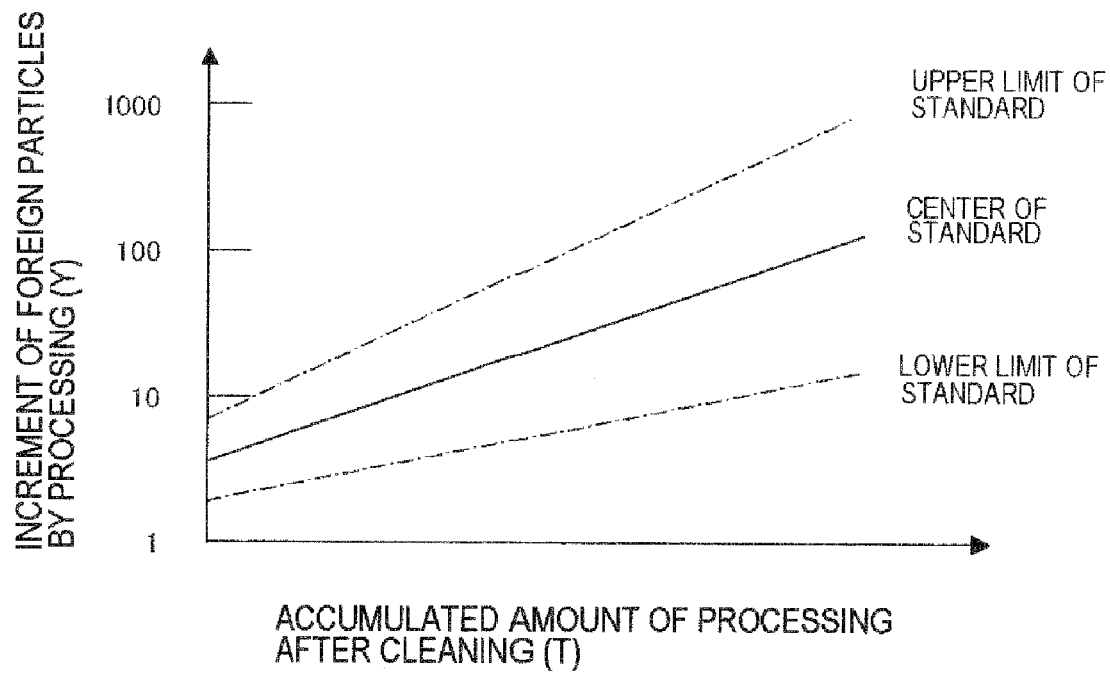
FIG. 11 is a graph showing an example of a relation of deposited foreign particles on a substrate and accumulated amount of etching after cleaning of a device, also including standard line, upper limit of the standard and lower limit of the standard.

For the standard line of the present invention used for management of measured values which increase exponentially, there are allowable tolerances including at least a tolerance α of an initial value and a tolerance β of gradient of a line drawn in a semi-logarithmic scale (FIG. 11).

Center of standard: $Y=Y_0 \times EXP[K \times T]$

Upper limit of standard: $Y\max=(Y_0+\alpha\text{upper}) \times EXP[(K+\beta\text{upper}) \times T]$ Lower limit of standard: $Y\min=(Y_0-\alpha\text{lower}) \times EXP[(K-\beta\text{lower}) \times T]$ Namely, the data managing method of the example observes (monitors) measured values whether or not they are distributed within a trapezoid standard range defined by $Y_0$ level with α and gradient of K with β as a tolerance, respectively. The αupper and αlower are upper range and lower width of the level tolerance α, and the βupper and βlower are upper range and lower range of the gradient tolerance β, respectively. When a function as the center line of standard is a composite (synthesized) function of a decreasing function and an increasing function, four or more kinds of tolerances are used, i.e., at least two tolerances of which are level tolerance α and gradient tolerance β for the decreasing function and the same for the increasing function.

EXAMPLE 10

Figure 12:
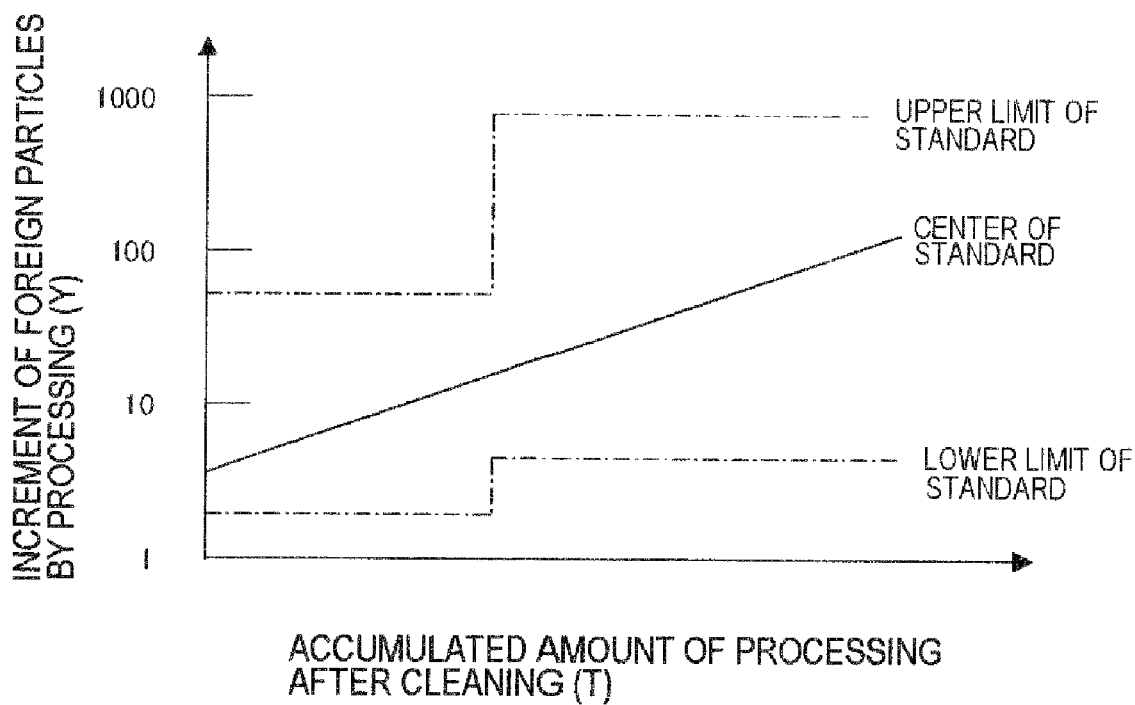
FIG. 12 is a graph showing an example of a relation of deposited foreign particles on a substrate and accumulated amount of etching after cleaning of a device, also including standard line, a stepped upper limit of the standard and a stepped lower limit of the standard.

A tenth example of the present invention is a variation of the ninth example of the present invention, having stepped management standard lines. The standard line used for management of measured values which increase exponentially has at least a tolerance α of an initial value and a tolerance β of gradient of a line drawn in a semi-logarithmic scale. This example shows an equipment and method which have a plurality (certain number) of stepped values in an upper limit of the standard and a lower limit of the standard as the management values to simplify the management (FIG. 12).

EXAMPLE 11

An eleventh example of the present invention is a variation of the fifth example of the present invention. When managing exponentially decreasing particles, the number of the particles is managed as explained in FIG. 9, that is, Center of standard: $Z=Z_0 \times EXP[-H \times T]$ Upper limit of standard: $Z\max=(Z_0+\gamma\text{upper}) \times EXP[-(H+\delta\text{upper}) \times T]$ Lower limit of standard: $Z\min=(Z_0-\gamma\text{lower}) \times EXP[-(H-\delta\text{lower}) \times T]$, That is, the data managing method of the instant example observes measured values whether or not they are distributed within a trapezoid standard range spaced by $Z_0$ level with γ and gradient of H with δ as a tolerance, respectively. The γupper and γlower are upper range and lower range of the level tolerance γ, and the δsupper and δlower are upper range and lower range of the inclination tolerance δ, respectively. Thus the number of the pollution particles when a decreasing type pollution and an increasing pollution are copresent is managed whether or not the measured values fall within the standard range using tolerances α, β, γ and δ based on an equation of the number of the particles: N=Y+Z.

EXAMPLE 12

A twelfth example of the present invention is explained. The minimum value $R^2$min of R square ($R^2$) is predetermined for judging the accuracy of the approximated equation derived from a group of measured values ($0<R^2\min \leq R^2 \leq 1$) When $R^2$ of an approximated equation using measured values is smaller than the $R^2$min, it is judged that the group of measured values includes abnormal values and reselection of appropriate values among the group of the measured values is done until $R^2$ becomes larger than the $R^2$min.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modification aforementioned.

What is claimed is:

1. A data processing and management equipment, comprising:
    a functional approximation part that makes a mathematical model of a relation between measured numbers of particles deposited on a substrate during processing in a surface structuring device or a film forming device and an accumulated amount processed after cleaning up of the device by a functional equation based on a cause of the deposit of the particles, and
    a judging part that specifies cause of the deposit of particles by comparing the functional equation with the measured numbers of particles.

2. The data processing and management equipment according to claim 1; wherein
    the functional equation is an exponential equation, and
    the judging part specifies the cause of the deposit of particles by comparing an initial value, an inclination of a regression exponential equation obtained by regression analysis of the measured numbers of particles and coefficient(s) of determination of the exponential equation with experienced values.

3. The data processing and management equipment according to claim 1; wherein
    the judging part estimates existence of disorder or cleaning time of the surface structuring device or the film forming device by comparing an initial value, an inclination and coefficient(s) of determination of a regressive exponential equation of every process cycle after cleaning with each other, wherein the regressive exponential equation is obtained by a regression analysis on an amount of particles increased per unit area to an accumulated depth of the structured surface or an accumulated height of the formed film per unit area after cleaning up of the surface structuring device or the film forming device.

4. The data processing and management equipment according to claim 1; wherein
    the judging part estimates existence of an influence of an adjacent device upon the number of particles by comparing the number of particles per unit area against an accumulated depth of the structured surface or an accumulated height of the formed film per unit area after cleaning up of the surface structuring device or the film forming device with an operation time, date and contents of the operation of the adjacent device.

5. The data processing and management equipment according to claim 1; wherein the judging part specifies the cause of the deposit of particles by a result of analysis of shape and composition of the particles.

6. The data processing and management equipment according to claim 1, comprising a display part that displays on a screen of the equipment and/or outputs data of the measured particles and the functional approximation line in a graph of semi-logarithmic coordinate system.

7. The data processing and management equipment according to claim 6, wherein the display part also graphically displays the functional regression equation of the functional regression line and coefficient(s) of determination representing accuracy of the functional regression equation.

8. The data processing and management equipment according to claim 6, wherein the display part also describes operation time and date, and contents of the operation of an adjacent device.

9. The data processing and management equipment according to claim 6, wherein the display part also displays and/or outputs a result of judgment of the judging part has judged.

10. The data processing and management equipment according to claim 7, wherein the judging part determines at least two kinds of tolerances of level of an initial value and gradient of the functional approximation equation as a center line of a standard.

11. The data processing and management equipment according to claim 7, wherein the judging part determines at least four kinds of tolerances of two kinds of initial values and two kinds of gradients of both a decreasing-type equation and an increasing-type equation when the functional approximation equation as a center line of a standard is a composite function of the decreasing-type equation and the increasing-type equation.

12. A data processing and management method, comprising:
   a) approximating a relation between measured numbers of particles deposited on a substrate during processing in a surface structuring device or a film forming device and accumulated amount processed after cleaning up of the device by a functional equation based on a cause of the deposit of the particles; and
   b) specifying cause of the deposit of particles by comparing the functional equation with the measured numbers of particles.

13. The data processing and management method according to claim 12; wherein
   the functional equation is an exponential equation, and
   said specifying b) specifies the cause of the deposit of particles by comparing an initial value, a gradient of the regression exponential equation obtained by regression analysis of the measured numbers and coefficient(s) of determination of the exponential equation with experienced values.

14. The data processing and management method according to claim 12; wherein
   said specifying b) estimates existence of disorder or cleaning time of the surface structuring device or the film forming device by comparing an initial value, a gradient and coefficient(s) of determination of a regressive exponential equation of every process cycle after cleaning with each other, wherein the regressive exponential equation is obtained by a regression analysis of an amount of particles increased per unit area to an accumulated depth of the structured surface or an accumulated height of the formed film per unit area after cleaning up of the surface structuring device or the film forming device.

15. The data processing and management method according to claim 12; wherein
   said specifying b) estimates existence of influence of a adjacent device upon the numbers of particles by comparing the numbers of particles per unit area against an accumulated depth of the structured surface or an accumulated height of the formed film per unit area after cleaning up of the surface structuring device or the film forming device with operation time and date, and contents of the operation of the adjacent device.

16. The data processing and management method according to claim 12; wherein said specifying of b) specifies the cause of the deposit of particles by a result of analysis on shape and composition of the particles.

17. The data processing and management method according to claim 12, comprising:
   c) displaying on a screen of an equipment and/or outputting data of the measured particles and the functional approximation line of a graph of semi-logarithmic coordinate system.

18. The data processing and management method according to claim 17, wherein said displaying of c) also describes the functional regression equation of the functional regression line and coefficient(s) of determination representing accuracy of the functional regression equation in the graph.

19. The data processing and management method according to claim 17, wherein said displaying of c) also displays operation time and date, and contents of the operation of an adjacent device.

20. The data processing and management method according to claim 17, wherein said displaying of c) also displays and/or output the result of said specifying b).

21. The data processing and management method according to claim 18, wherein said specifying of b) determines at least two kinds of tolerances of initial value and gradient of the functional approximation equation as a center line of a standard.

22. The data processing and management method according to claim 18, wherein said specifying of b) determines at least four kinds of tolerances including two kinds of initial values and two kinds of gradients of both a decreasing-type equation and an increasing-type equation when the functional approximation equation as a center line of a standard is a composite function of the decreasing-type equation and the increasing-type equation.

* * * * *